(12) United States Patent
Lai

(10) Patent No.: US 7,049,215 B2
(45) Date of Patent: May 23, 2006

(54) THIN FILM TRANSISTOR ARRAY PANEL AND FABRICATING METHOD THEREOF

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/907,782

(22) Filed: Apr. 15, 2005

(65) Prior Publication Data

US 2005/0170564 A1    Aug. 4, 2005

Related U.S. Application Data

(62) Division of application No. 10/707,139, filed on Nov. 24, 2003, now Pat. No. 6,911,669.

(30) Foreign Application Priority Data

Jun. 26, 2003    (TW) .............................. 92117364 A

(51) Int. Cl.
    *H01L 21/44*    (2006.01)
(52) U.S. Cl. ..................... 438/612; 438/149; 438/257

(58) Field of Classification Search ................ 438/612, 438/48, 149, 257; 257/59, 72
See application file for complete search history.

(56) References Cited

U.S. PATENT DOCUMENTS

| | | | |
|---|---|---|---|
| 2001/0019125 A1* | 9/2001 | Hong et al. ................... 257/59 |
| 2002/0130324 A1* | 9/2002 | Song et al. ................... 257/72 |
| 2003/0109126 A1* | 6/2003 | Terasawa et al. ........... 438/612 |
| 2004/0029308 A1* | 2/2004 | Kong et al. ................... 438/48 |

* cited by examiner

*Primary Examiner*—Michael Lebentritt
*Assistant Examiner*—Mohsen Ahmadi
(74) *Attorney, Agent, or Firm*—Jianq Chyun IP Office

(57) ABSTRACT

A method of forming a thin film transistor array panel is described. The thin film transistor array comprises a substrate, a plurality of scan lines, a plurality of gates a plurality of first bonding pads and a plurality of second bonding pads, wherein the first bonding pads are connected with the scan lines. The first bonding pads and the second bonding pads are formed as a part of the first metal layer. The data lines are extended to electrically connected with the second bonding pads via contact windows.

8 Claims, 19 Drawing Sheets

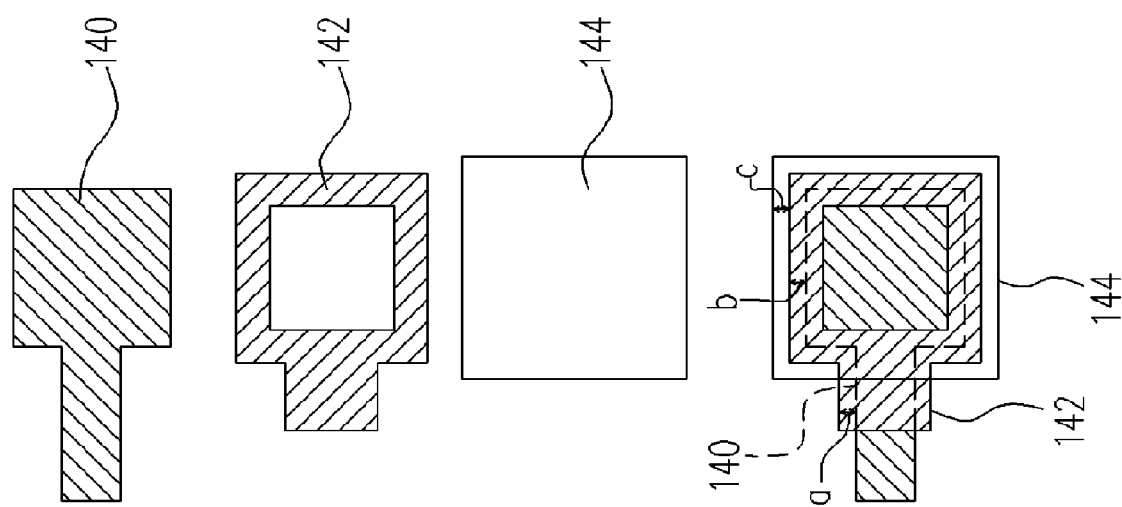

THIN FILM TRANSISTOR ARRAY PANEL AND FABRICATING METHOD THEREOF

CROSS-REFERENCE TO RELATED APPLICATION

This application is a divisional of a prior application Ser. No. 10/707,139, filed Nov. 24, 2003 now U.S. Pat. No. 6,911,669, which claims the priority benefit of Taiwan application Ser. No. 92117364, filed Jun. 26, 2003.

BACKGROUND OF THE INVENTION

1. Field of the Invention

The invention relates in general to a thin film transistor (TFT) array and manufacturing method thereof, and more particularly to a thin film transistor array having a high opening rate and fabricating method thereof.

2. Related Art of the Invention

A thin film transistor (TFT) liquid crystal display (LCD) is constructed of at least a thin film transistor array substrate, a color filter array substrate and a liquid crystal layer. The thin film transistor array substrate is composed of a plurality thin film transistors arranged in an array, in which each one of the thin film transistors are disposed with a corresponding pixel electrode. The thin film transistor described above includes a gate, a channel layer, a drain and a source. The thin film transistor is provided as a switching device of the liquid crystal display unit.

The operation principle of the thin film transistor device is similar to that of a conventional MOS device, in which both of them includes three terminals (gate, drain and source). In general, a thin film transistor device can be classified into two types, one is an amorphous silicon type and the other is an poly-silicon type, in which the amorphous silicon thin film transistor is more fully developed than the others. With respect to an amorphous silicon thin film transistor liquid crystal display (LCD), the process flow of manufacturing thereof at least includes forming a gate, a channel layer, a source/drain, a pixel electrode and a cover layer over the substrate.

FIG. 1 is a top view illustrating a conventional thin film transistor array, and FIG. 1A to FIG. 1E are cross-sectional views illustrating a process flow chart of a method of forming a thin film transistor array substrate.

Referring to FIG. 1 and FIG. 1A, first of all, a substrate 100 is provided. Next, a first masking process is performed to form a gate 12 and a scan line 20 connecting to the gate 12. In the meantime, a bonding pad 24 is formed at the terminal of the scan line 20, and then a gate dielectric layer 50 is formed over the substrate 10.

Referring to FIG. 1 and FIG. 1B, a second masking process is performed to form a channel layer 14 and an ohm contact layer 15 on the gate dielectric layer 50 over the gate 12.

Referring to FIG. 1 and FIG. 1C, a third masking process is performed to form source/drain 16a/16b and a data line 22 connecting to the source 16a, and another bonding pad 26 is formed at the terminal of the data line 22.

Referring to FIG. 1 and FIG. 1D, a fourth masking process is performed to form a patterned cover layer 52 over the substrate 10 for exposing the drain 16b. The bonding pad 26 and the gate dielectric layer 50 are located at an upper level with respect to the bonding pad 24.

Referring to FIG. 1 and FIG. 1E, a fifth masking process is performed to form a patterned low dielectric photoresist layer 54 over the cover layer 52 for exposing portions of the drain 16b and the bonding pads 26, 24 (exposure of bonding pad 24 not shown). Then, the gate dielectric layer 50 on the bonding pad 24 is removed by using the photoresist layer 54 as an etching mask. Thereafter, a sixth masking process is performed to form pixel electrode 30 on the photoresist layer 54, and to cover indium zinc oxide (IZO) layers 32, 34 over the surface of the bonding pads 26, 24.

The purpose of forming a low dielectric photoresist layer above the cover layer is to enhance the opening rate of the liquid crystal display. Because of the existence of the low dielectric photoresist layer, the pixel electrode is extended to cover a portion of the data line to enhance the opening rate. It is noted that the thickness of the low dielectric photoresist layer is thick enough, therefore the parasitic capacitance between the pixel electrode and the data line is reduced, and the electrical property of the LCD panel will not be influenced.

However, in the method described above, after a patterned cover layer is provided in a masking process, then another masking process is provided for patterning the low dielectric photoresist layer. Therefore, one more masking process is required, and therefore the process is more complicated. Moreover, if the above process were to be simplified applying a masking process for patterning the low dielectric photoresist layer with one etching step, however in the resulting structure the bonding pad 26 would remain exposed and unprotected. Therefore in the subsequent step, the surface of the bonding pad 26 may get damaged due to its exposure to the reactant used in the subsequent process, for example, the developer and the etching chemicals, and also during the steps of forming a low dielectric photoresist layer 54 and then etching the gate dielectric layer 50 above the bonding pad 24.

SUMMARY OF THE INVENTION

Accordingly, one object of the present invention is to provide a thin film transistor array substrate and the manufacturing method thereof, to solve the problems of the conventional process.

It is another object of the present invention to provide a thin film transistor array substrate and manufacturing method thereof, for simplifying the manufacturing process and preventing the bonding pad that is electrically connected to the data line from the damage during the manufacturing process.

To achieve these and other advantages and in accordance with the purpose of the invention, as embodied and broadly described herein, the present invention provides a manufacturing method for a thin film transistor array substrate. According to this method, a substrate is provided, a plurality of scan lines and a plurality of gates are formed over the substrate, wherein the gates are electrically connecteded to the scan lines on a substrate, and a plurality of first bonding pads and a plurality of second bonding pads are formed over two edges of the substrate at the same time, wherein the first bonding pads and the scan lines are electrically connected. Next, a gate dielectric layer is formed over the substrate for covering the scan lines, the gates, the first bonding pads and the second bonding pads. Next, a plurality of channel layers is formed over the gate dielectric layers of each of the gates. Thereafter, a source/drain is formed on each of the channel layers, and a data line is formed to electrically connect with all the sources on the gate dielectric layers, wherein a terminal of each of data lines is extended to every second bonding pads. The gates, the channel layers and the source/drain constitute a plurality of thin film transistors.

In the above enbodiment, preferably a first mask layer and a second mask layer are formed over the gate dielectric layers covering the first bonding pads and the second bonding pads. Preferably the first mask layer and the second mask layer are formed when forming the source/drain and the data line. Alternatively, the first mask layer and the second mask layer can be formed when forming the channel layer. Moreover, the first and the second mask layer may be comprised of a bilayer structure having a top layer and a bottom layer and preferably, the top layer is formed when forming the source/drain and the data line and the bottom layer is formed when forming the channel layer. Then, a cover layer is formed on the substrate, and a patterned low dielectric photoresist layer is formed over the cover layer. Next, a photoresist layer is formed over the covering layer partially covering over the two edges of the substrate, wherein the photoresist layer comprises a plurality of first openings, a plurality of second openings and a plurality of third openings. A portion of the cover layer above the drain is exposed within the first opening, a portion of the cover layer over the data line is exposed within the second opening, and a portion of the cover layer over the second bonding pad is exposed within the third opening. Next, using the photoresist layer as an etching mask, the portions of the cover layer and the gate dielectric layer that are not covered by the photoresist layer are removed. Thus, the drain and the data line adjacent to the edge of the substrate, and the second bonding pad adjacent to the data line are exposed. In the etching step, a portion of the first mask layer and the second mask layer disposed over the two edges of the substrate is also provided as an etching mask. Thus, the portion of the gate dielectric layer over the two edges of the substrate that is not coverd by the first/second mask layer is removed in the etching step, and the first bonding pad and the second bonding pad are exposed. Finally, a plurality of pixel electrodes are formed over the photoresist layer, and an electrode material layer in the second and third openings and over the first bonding pad and the second bonding pads, wherein the drain and pixel electrode are electrically connected via the first opening. The data line and the second bonding pad are electrically connected via the second and third openings and the electrode material layer.

It is to be noted that, if the first mask layer and the second mask layers were formed when forming the channel layer, then the first mask and the second mask layer need to be removed resulting in removal of an upper portion of the gate dielectric layer under the first mask layer and the second mask layer, and thereby thinning or reducing the thickness of the gate dielectric layer. Therefore, the thickness of the gate dielectric layer under the first mask layer and the second mask layer will be less than the thickness of the original gate dielectric layer.

In accordance with a further object of the present invention, the present invention provides a thin film transistor array including a plurality of scan lines, a plurality of first bonding pads, a plurality of second bonding pads, a gate dielectric layer, a plurality of data lines, a plurality of first mask layers, a plurality of second mask layers, a plurality of thin film transistors, a cover layer, a low dielectric photoresist layer and a plurality of pixel electrodes. The scan line is disposed on the substrate. The first bonding pad is disposed on an edge of the substrate, wherein the first bonding pad is electrically connected with the scan line. The second bonding pad is disposed on another edge of the substrate. Moreover, the gate dielectric layer is disposed on the substrate, and portions of the first/second bonding pads are exposed within the gate dielectric layer. The data line is disposed over the gate dielectric layer, wherein the data line is extended to the edge of the substrate and electrically connected with the second bonding pad. In addition, the first mask layer is disposed on the gate dielectric layer over the first bonding pad, and a portion of the first bonding pad is exposed by the first mask layer. The second mask layer is disposed on the gate dielectric layer over the second bonding pad, and a portion of the second bonding pad exposed is exposed by the second mask layer. Moreover, the thin film transistor is disposed over the substrate, wherein each of the thin film transistors includes a gate, a source/drain and a channel layer. Each of the gates is electrically connected to each of the scan lines, and each of the sources is electrically connected with each of the data lines. Each of the channel layers is disposed over each of the gate dielectric layers of the gates. The cover layer is disposed over the substrate, and the low dielectric photoresist layer is disposed over the cover layer. The part of two edges of the substrate covered by the first mask layer and the second mask layer not covered by the low dielectric photoresist layer remain exposed. The pixel electrode is disposed over the low dielectric photoresist layer corresponding to the thin film transistors, in which each of the pixel electrodes is electrically connected with each of the drain.

In the above thin film transistor array, the material of the first mask layer and the second mask layer is same as that of the source/drain and the data line, also they can be same as that of the channel layer. Moreover, the first mask layer and the second mask layer can be comprised of a bilayer structure having a top layer and a bottom layer, in which the material of the top layer can be same as that of the source/drain and the data line, and the material of the bottom layer can be same as that of the channel layer.

In accordance with a further object of the present invention, the present invention provides a thin film transistor array including a plurality of scan lines, a plurality of first bonding pads, a plurality of second bonding pads, a gate dielectric layers, a plurality of data lines, a plurality of thin film transistors, a cover layer, a low dielectric photoresist layer and a plurality of pixel electrodes. The scan line is disposed over the substrate. The first bonding pads are disposed over an edge of the substrate, wherein the first bonding pads are electrically connected with the scan lines. The second bonding pads are disposed over another edge of the substrate. Moreover, the gate dielectric layer is disposed over the substrate, wherein portions of the first bonding pads and the second bonding pads are exposed by the gate dielectric layer. The thickness of the gate dielectric layer over the edge of the first bonding pads and the second bonding pads and is less than a thickness any other portions of the gate dielectric layer. Moreover, the data line is disposed over the gate dielectric layer, wherein the data lines extended to the edge of the substrate to electrically connect with the second bonding pads. The thin film transistors are disposed over the substrate, wherein each of the thin film transistors includes a gate, a source/drain and a channel layer. Each of the gates is electrically connected with each of the scan lines, and each of the sources is electrically connected with each of the data lines. Each of the channel layers is disposed over the each of the gate dielectric layers of the gate. In addition, the cover layer is disposed over the substrate, the low dielectric photoresist layer is disposed over the cover layer. The two edges of the substrate having the first bonding pads and the second bonding pads are exposed by the low dielectric photoresist layer. The pixel electrodes are disposed over the low dielectric photoresist layer corresponding to the thin film transistors, wherein each of the pixel electrodes is electrically connected with each of the drain.

Accordingly, in the manufacturing method of a thin film transistor array substrate of the present invention, the second bonding pads electrically connected to the data line is formed under the gate dielectric layer and disposed in the first metal layer. Therefore, the problem of the damaging the second bonding pad as in the case of the conventional process can be effectively resolved.

Moreover, in the present invention, because the first mask layer and the second mask layer are provided for protecting the first bonding pads and the second bonding pads, and therefore only one mask is required for patterning of the low dielectric photoresist layer and the cover layer, and therefore the process the invention is more simplified compared to the conventional process, and further, damaging of the first bonding pads and the second bonding pads during the processing can be effectively prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2B is a view illustrating the second bonding pad shown in FIG. 2A;

DETAILED DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2A:
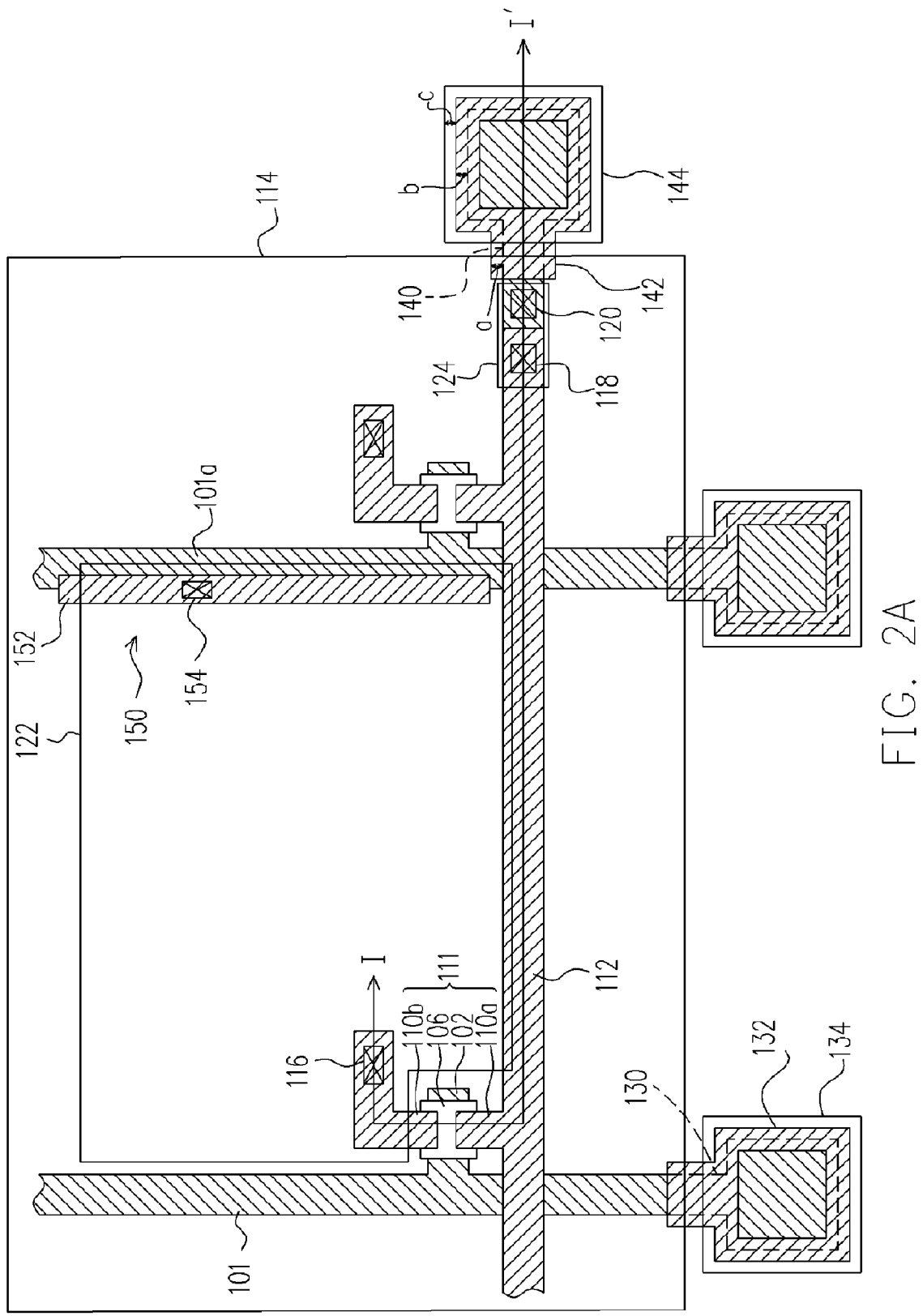
FIG. 2A is a top view illustrating a thin film transistor array according to a first embodiment of the present invention.

Hereinafter, FIG. 2A is a top view illustrating a thin film transistor array according to the first embodiment of the present invention. FIG. 2B is a view illustrating the second bonding pad shown in FIG. 2A. FIG. 3A to FIG. 3H are cross-sectional views illustrating the progression steps of a process of fabricating a thin film transistor array substrate corresponding to the cross-sectional view along line II–II' of FIG. 2A according to the first embodiment of the present invention.

A thin film transistor array substrate and the manufacturing method thereof of the present invention will be described in detail in the followings, in which a pixel structure and a portion of the bonding pad will be described referring to the figures.

Figure 3A:
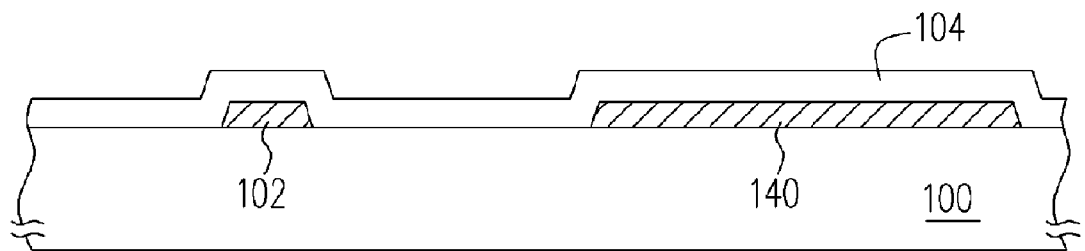
FIG. 3A to FIG. 3H are cross-sectional views illustrating the progression steps of the process of fabricating a thin film transistor array substrate corresponding to the cross-sectional view along line II–II' of FIG. 2A according to the first embodiment of the present invention.

Referring to FIG. 2A and FIG. 3A, first of all, a substrate 100 is provided. Next, a first masking process is performed to form a scan line 101 and a gate 102 over the substrate 100, wherein the gate 102 is connected with the scan line 101. Next, a first bonding pad 130 and a second bonding pad 140 are formed over two edges of the substrate 100. The first bonding pad 130 is electrically connected with the scan line 101. The scan line 101, the gate 102, the first bonding pad 130 and the second bonding pad 140 are disposed in the first metal layer (M1).

Thereafter, a gate dielectric layer 104 is formed on the substrate 100 to cover the scan line 101, the gate 102, the first bonding pad 130 and the second bonding pad 140. A material of the gate dielectric layer 104 includes, for example but not limited to, a silicon nitride or a silicon oxide.

Figure 3B:
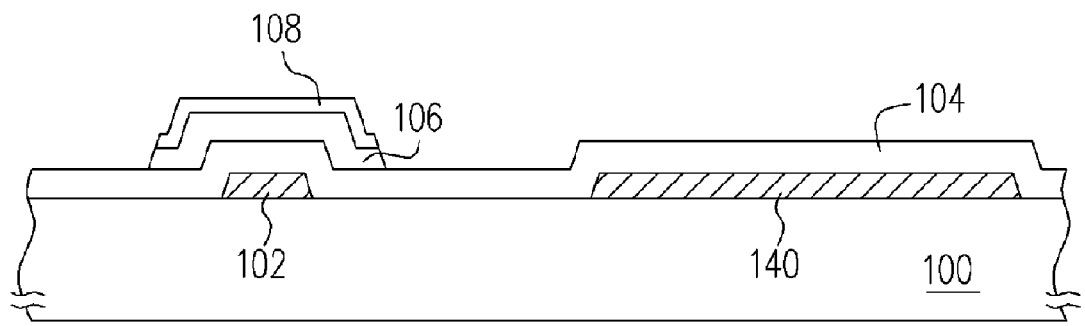

Next, referring to FIG. 2A and FIG. 3B, a second masking process is performed to form a channel layer 106 and an ohm contact layer 108 on the gate dielectric layer 104 over the gate 102. A material of the channel layer 106 includes, for example but not limited to, an amorphous silicon (a–Si). A material of the ohm contact layer 108 includes, for example but not limited to, a doped amorphous silicon (n+–Si).

Figure 3C:
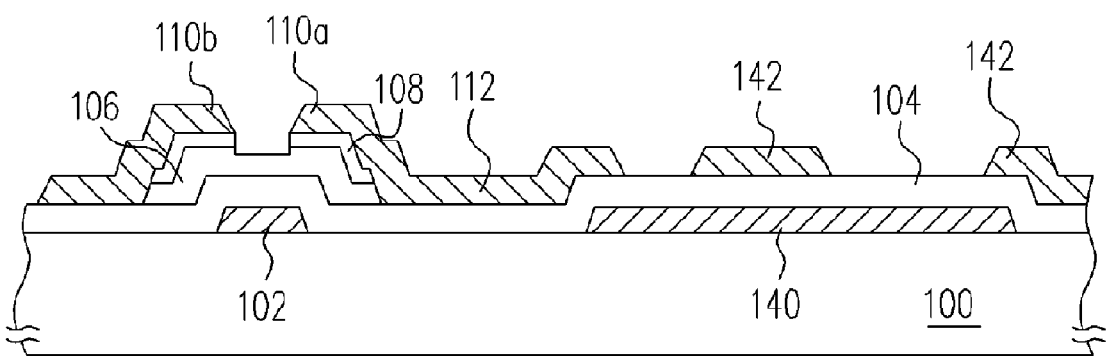

Referring FIG. 2A and FIG. 3C, a third masking process is performed to form a source 110a, a drain 110b on the ohm contact layer 108, and a data line 112, wherein the data line 122 is connected with the source 110a. A terminal of the data line 112 extends to the second bonding pad 140. The gate 102, the source 110a, the drain 110b and the channel layer 106 constitute a thin film transistor 111. Wherein, during the step of forming the source 110a, the drain 110b and the data line 112, a conductive layer 152 is further formed over the gate dielectric layer 104 and another scan line 101a being adjacent to the scan line 101. Hereinafter, the conductive layer 152 is provided as a top electrode of a pixel storage capacitor. Here, the source 110a, the drain 110b, the data line 112 and the conductive layer 152 are disposed in a second metal layer (M2).

Particularly, in the present embodiment, when the second metal layer including the source 110a, the drain 110, the data line 112 and the conductive layer 152 is formed, a first mask layer 132 and second mask layer 142 are formed over the gate insulating layer 104, the first bonding pad 130 and the second bonding pad 140. Wherein the edges of the first/second bonding pad 130/140 are covered at least by the first/second mask layers 132/142. For example, in the second bonding pad 140 and the second mask layer 142 shown in FIG. 2B, a distance "a" and a distance "b" between the second mask layer 142 and the second bonding pad 140 is larger than 0 or equal to 0. Because a material of the first/second mask layer 132/142 include a metal material, the area thereof are preferably not too large, therefore the first/second mask layers 132/142 can be designed in a ring pattern to cover the edge of the first/second bonding pads 130/140.

Figure 3D:
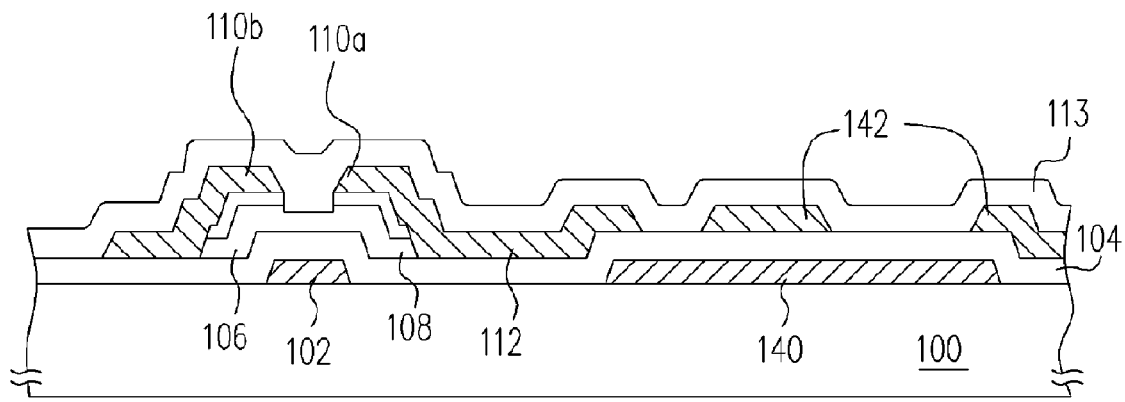

Hereinafter, referring to FIG. 3D, after the second metal layer is formed, a cover layer 113 on the substrate 100 is formed to cover the second metal layer, i.e., covering the source, 110a, the drain 110b, the data line 112, conductive layer 152 and the first/second mask layers 132/142. A material of the cover layer 113 includes, for example but not limited to, a silicon nitride or a silicon oxide.

Figure 3E:
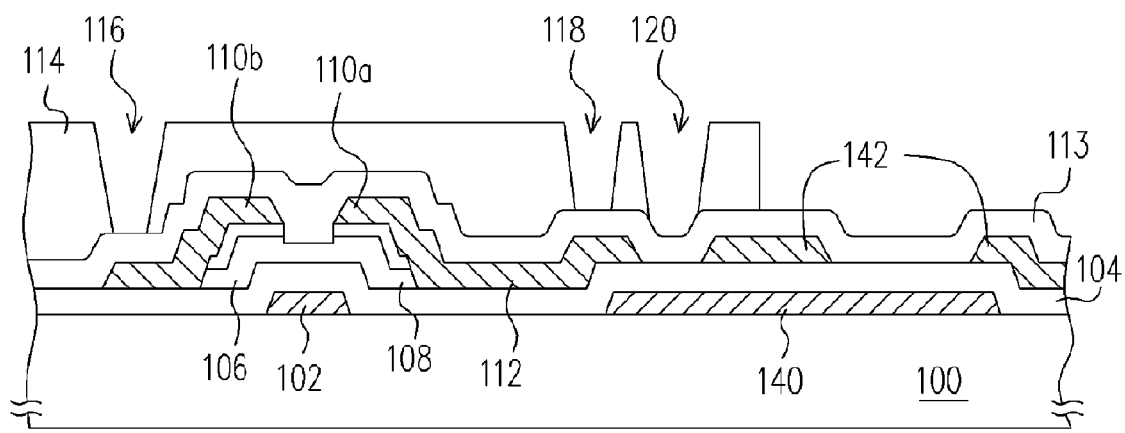

Referring FIG. 2A and FIG. 3E, a fourth masking process is performed to form a patterned low dielectric photoresist layer 114 over the substrate 100 for covering the cover layer 113 and partially covering the two edges of the substrate 100 (i.e., partially covering the two edges of the first bonding pad 130 and the second bonding pad 140). Moreover, in the above patterning step, a first opening 116, a second opening 118 and a third opening 120 are formed in the low dielectric photoresist layer 114. The first opening 116 is positioned over the drain 110b. The second opening 118 is positioned over a portion of the data line 112 in the edge of the substrate 100. The third opening 120 is formed over the second bonding pad 140 adjacent to the data line 112. Wherein, a thickness of the low dielectric photoresist layer 114 is greater than 800 nm, and a method of forming the patterned low dielectric photoresist layer 114 includes, for example but not limited to, coating a photoresistance material layer and then patterning the photoresistance material layer by a lithography process.

Figure 3F:
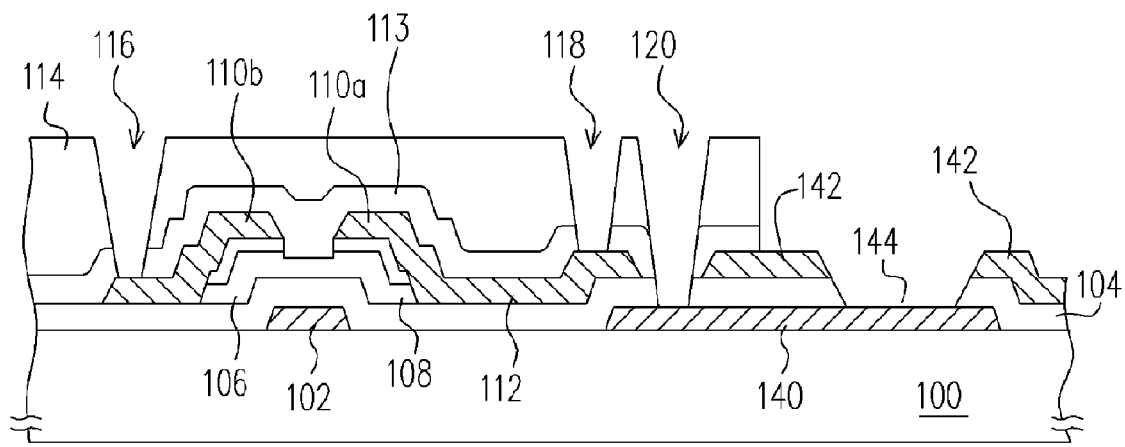

Next, referring to FIG. 2A and FIG. 3F, by using the low dielectric photoresist layer 114 as an etching mask, portions of the cover layer 113 and gate dielectric layer 104 that are not covered by the low dielectric photoresist layer 114 are removed until portions of the drain 110b, the data line 112 adjacent to the edge of the substrate 100, and the second bonding pad 140 adjacent to the data line 112 respectively are exposed. Moreover, in the etching step, the remaining part of the first/second mask layers 132/142 adjacent to the two edges of the substrate 100 are also provided as an etching mask, in order to remove the gate dielectric layer 104 that are not covered by the first/second mask layers 132/142 in the two edges of the substrate 100, and to expose a portion of the first bonding pad 130 and a portion of the second bonding pad 140.

Figure 3G:
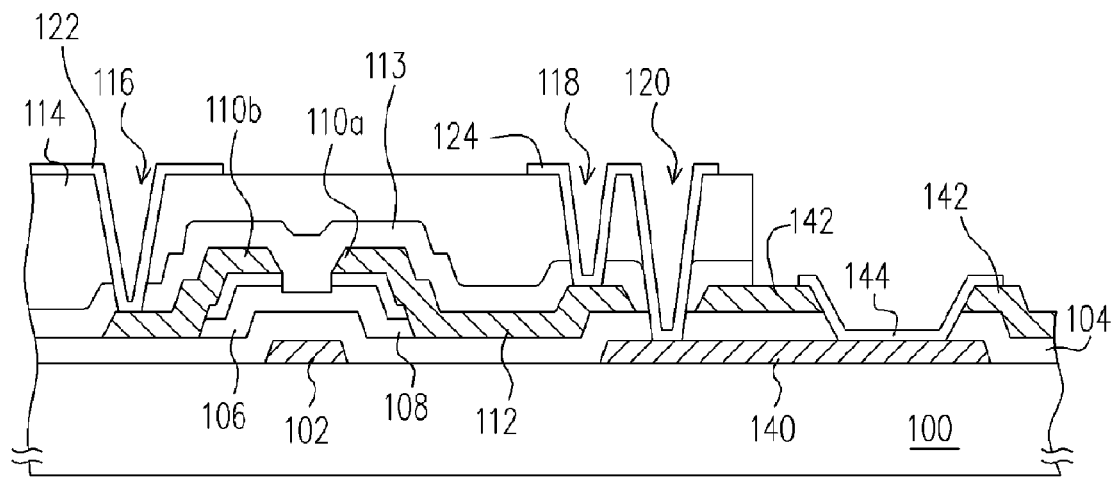

Referring to FIG. 2A and FIG. 3G, a fifth masking process is performed to form a pixel electrode 122 on a surface over the low dielectric photoresist layer 114, wherein the pixel electrode 122 is electrically connected with the drain 110b via the first opening 116. During the step of forming pixel electrode 122, a portion of the electrode material layer 124 in the second opening 118 and in the third opening 120 are left behind electrically connecting with the data line 112 and the second bonding pad 140 respectively, therefore the data line 112 and the second bonding pad 140 are electrically connected. Then an electrode material layer 134/144 is formed on a surface over the first/second bonding pad 130/140, wherein a coverage area of the electrode material layer 134/144 covering over the first/second mask layer 132/142 is at least equal to the area of the layer 132/142. For example, as shown in FIG. 2B, a distance "c" between the second mask layer 142 and the electrode material layer 144 is larger than or equal to 0.

Referring FIG. 2A, the pixel electrode 122 formed above covers a portion of the data line 112, in order to enhance the opening rate of the thin film transistor array. Moreover, the pixel electrode 112 further covers the conductive layer 152 and a portion of the scan line 101a, in order to construct a pixel storage capacitor. Wherein, the pixel electrode 112 and the conductive layer 152 are provided as a top electrode, and the scan line 101a below is provided as a bottom electrode. The gate dielectric layer between the top electrode and the bottom electrode is proviced as a capacitance dielectric layer, wherein the pixel electrode 112 and the conductive layer 152 are electrically connected through an opening 154 formed in the low dielectric photoresist layer and the cover layer.

Figure 3H:
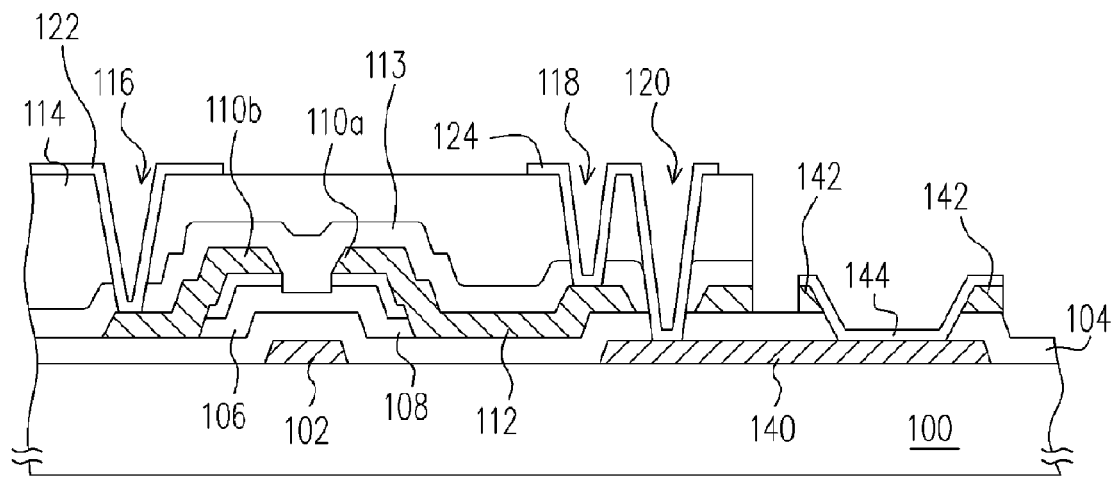

Hereinafter, referring to FIG. 3H, a portion of the first/second mask layer 132/142 that is not covered by the low dielectric photoresist layer 114 and the electrode material layers 134, 144 is removed.

In the present embodiment, since the second bonding pad 140 is formed under the cover layer 113, and the first and second bonding pads 130, 140 are disposed in the first metal layer, the second bonding pad 140 is exposed together with the first bonding pad 130 during the same step of process. Therefore, the damage of the second bonding pad 140 due to exposure thereof to the process reactants as in the case of conventional process can be effectively prevented. Moreover, since the first/second mask layer 132/142 covers the first/second bonding pad 130/140, and therefore the cover layer 113 and the low dielectric photoresist layer 114 can be patterned at the same time without damaging the first bonding pad 130 and the second bonding pad 140.

Figure 1:
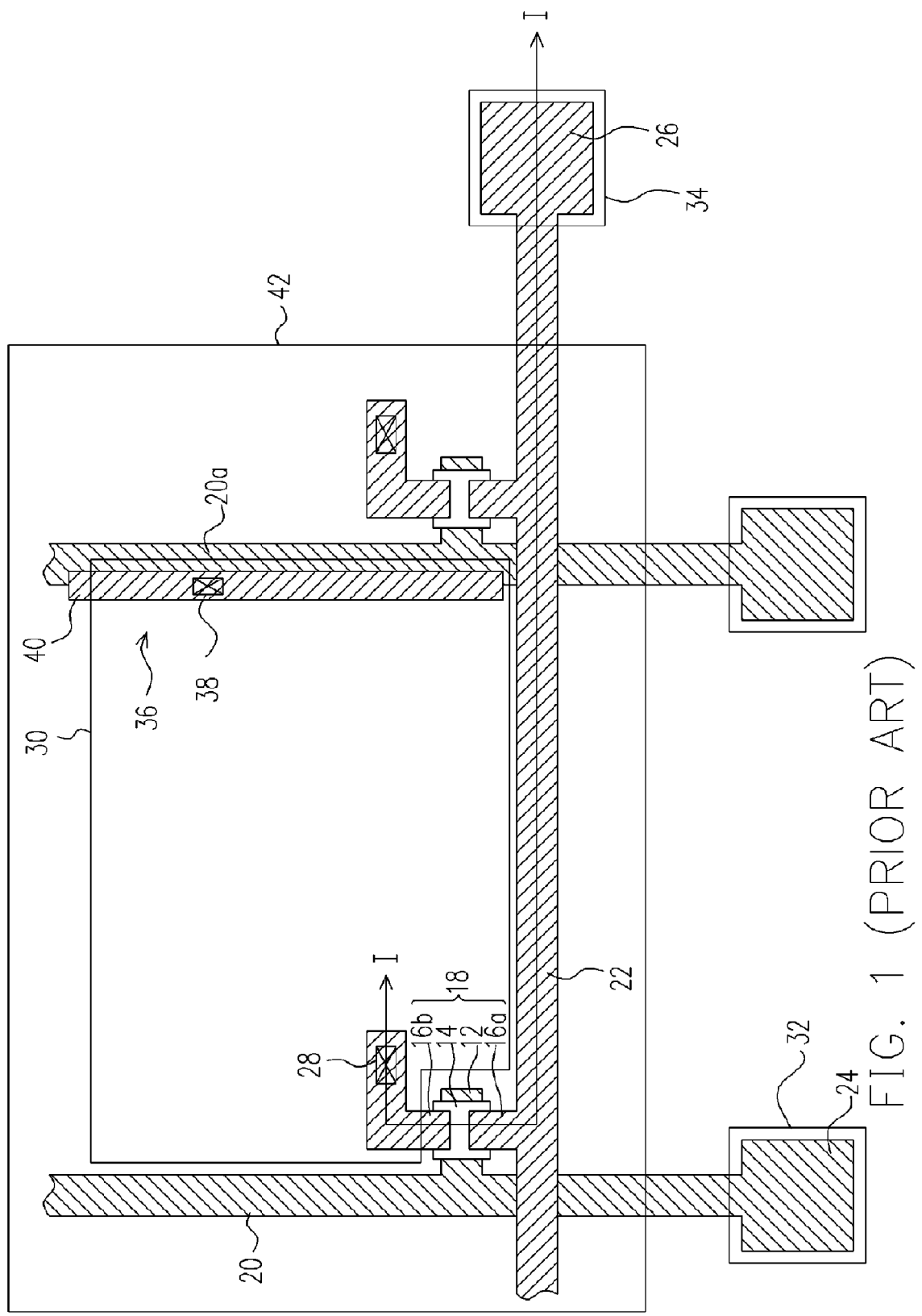
FIG. 1 is a top view illustrating a conventional thin film transistor array.
Figure 1A:
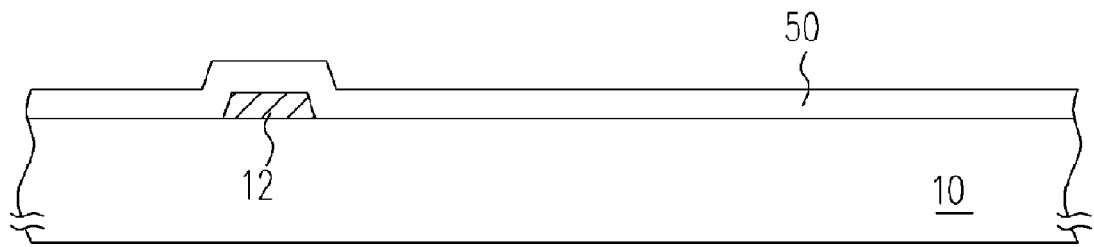
FIG. 1A to FIG. 1E are cross-sectional views illustrating the progression steps of the process of fabricating a thin film transistor array substrate corresponding to the cross-sectional view along line I–I' of FIG. 1.
Figure 1B:
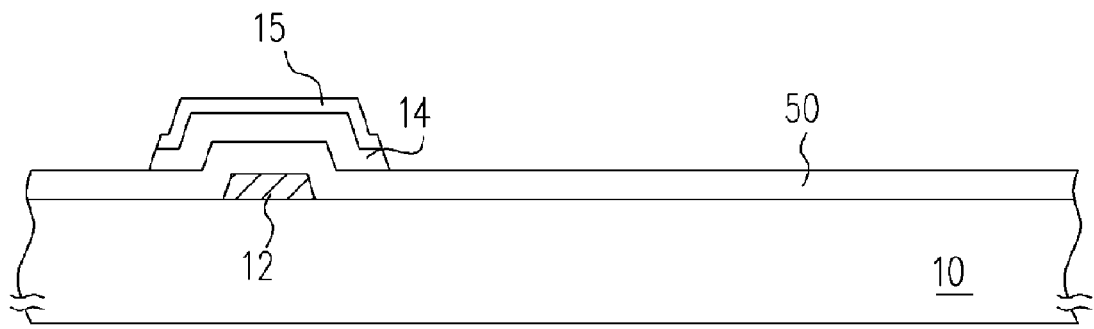
Figure 1C:
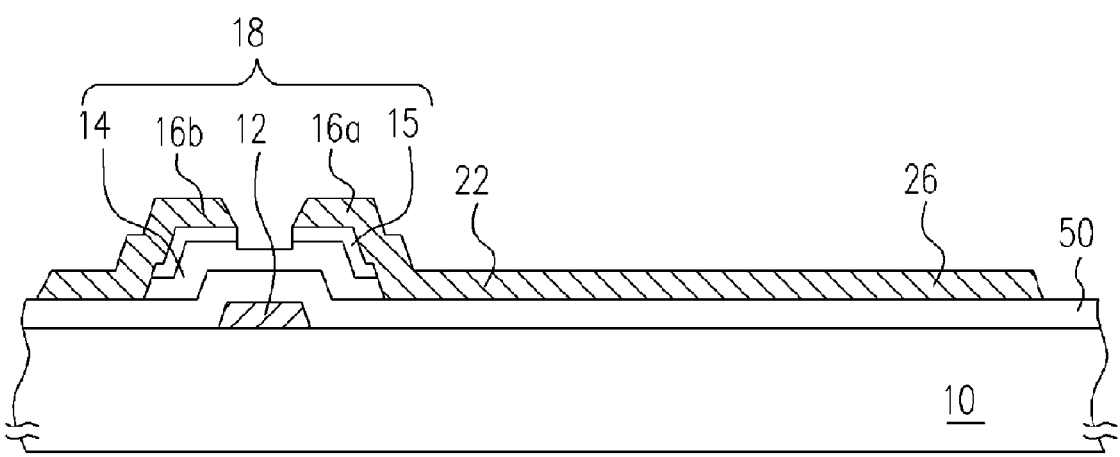
Figure 1D:
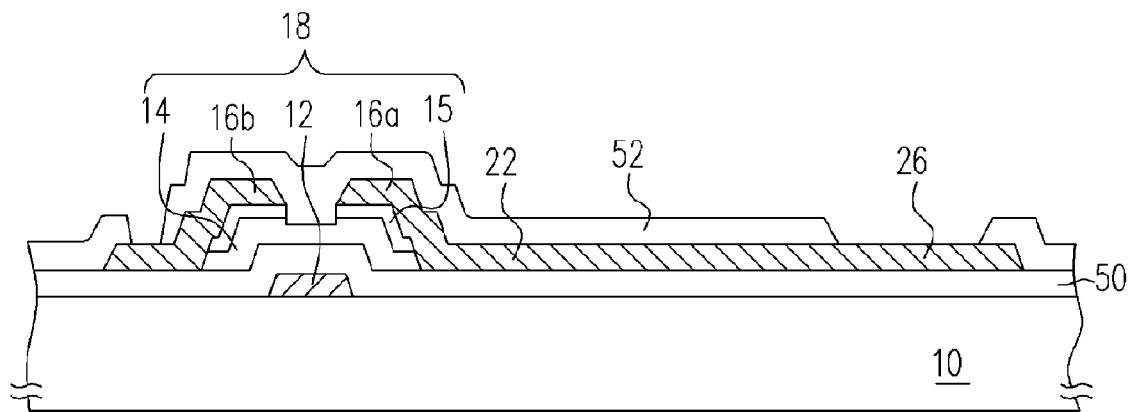
Figure 1E:
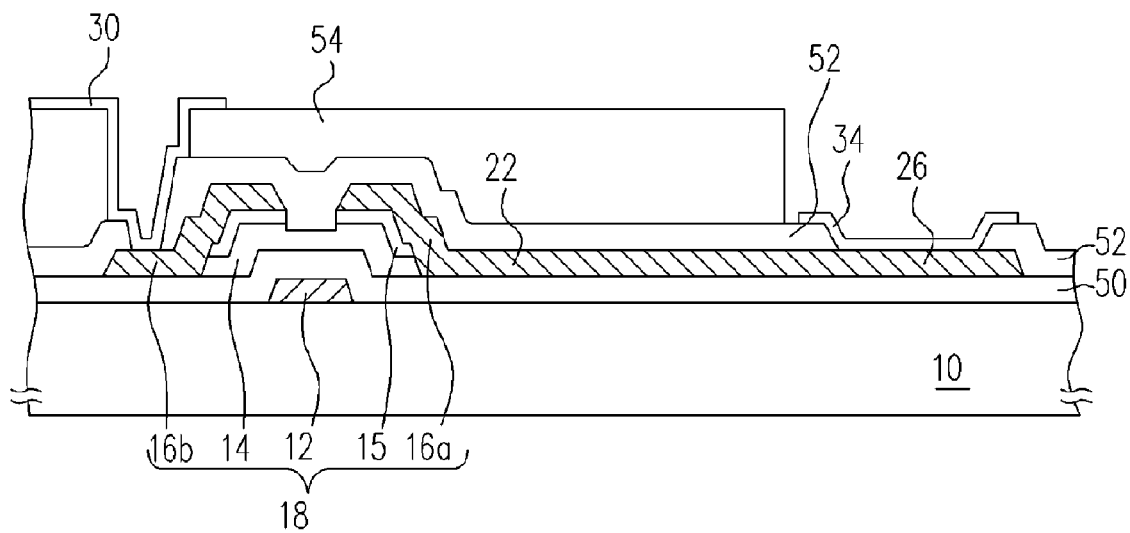

The thin film transistor array of the present embodiment as shown in FIG. 1A and FIG. 2E is constituted by the scan line 101, the first bonding pad 130, the second bonding pad 140, the gate dielectric layer 104, the data line 112, the first mask layer 132, the second mask layer 142, the thin film transistor 111, the cover layer 113, the low dielectric photoresist layer 114, the pixel electrode 122 and the pixel storage capacitor 150.

The scan line 101 is disposed on the substrate 100. The first bonding pad 130 is disposed at an edge of the substrate 100, wherein the first bonding pad 130 and the scan line 101 are electrically connected. The second bonding pad 140 is disposed over another edge of the substrate 100. Moreover, the gate dielectric layer 104 is disposed on the substrate 100, and a portion of the first/second bonding pad 134/144 is disposed within the gate dielectric layer 104. The data line 112 is disposed on the gate dielectric layer 104, wherein the data line 112 is extended to the edge of the substrate 100 and electrically connected with the second bonding pad 140 via the openings 118, 120 and the electrode material layer 124 formed in the openings 118, 120.

In addition, the first mask layer 132 is disposed on the gate dielectric layer 104 over the first bonding pad 130, and the first bonding pad 130 disposed within the gate dielectric layer 104 is also disposed within the first mask layer 132. The second mask layer 142 is disposed on the gate dielectric layer 104 over the second bonding pad 140, and a portion of the second bonding pad 140 exposed by patterning the gate dielectric layer 104 and the second mask layer 142, wherein the edge of the first/second bonding pad 130/140 is at least covered by the first/second mask layer 132/142. A material of the first/second mask layer 132/142 is the same as the material of the source/drain 110*a*/110*b* and data line 112.

Furthermore, the thin film transistor 111 is disposed on the substrate 100, wherein the thin film transistor 111 is constituted by the gate 102, the source/drain 110*a*/110*b* and the channel layer 106. The gate 102 is electrically connected with the scan line 101, and the source 110*a* is electrically connected with the data line 112. The channel layer 106 is disposed on the gate dielectric layer 104 over the gate 102.

The cover layer 113 and the low dielectric photoresist layer 114 are disposed over the substrate 100. The first mask layer 132, the second mask layer 142 covering the first bonding pad 130 and the second bonding pad 140 over two edges of the substrate 100 are not covered by the low dielectric photoresis layer 114 and remain exposed. The pixel electrode 122 is disposed over the low dielectric photoresist layer 114 corresponding to the thin film transistor 111. The pixel electrode 122 is electrically connected with the drain 110*b* via the contact window 116 disposed in the low dielectric photoresist layer 114 and the cover layer 113.

The pixel storage capacitor 150 is disposed on the scan line 101*a* adjacent to the scan line 101. The scan line 101*a* is provided as a bottom electrode, and the conductive layer 152 and the pixel electrode 112 (electrically connected via the contact window 154) over the scan line 101*a* is provided as a top electrode. The gate dielectric layer 104 between the top electrode and the bottom electrode is provided as a capacitance dielectric layer.

Hereinafter, a second embodiment of the present invention is described. In addition, in the present invention, if the material of the first mask layer and the second mask layer are comprised of an amorphous silicon material, the first mask layer and the second mask layer can be fabricated simutaneously as a single mask layer during the formation of the channel layer and the ohm contact layer. On the other hand, if the material of the first mask layer and the second mask layer is comprised of a metal, then the first mask layer and the second mask layer can be simultaneously fabricated during the formation of the second metal layer.

Figure 4A:
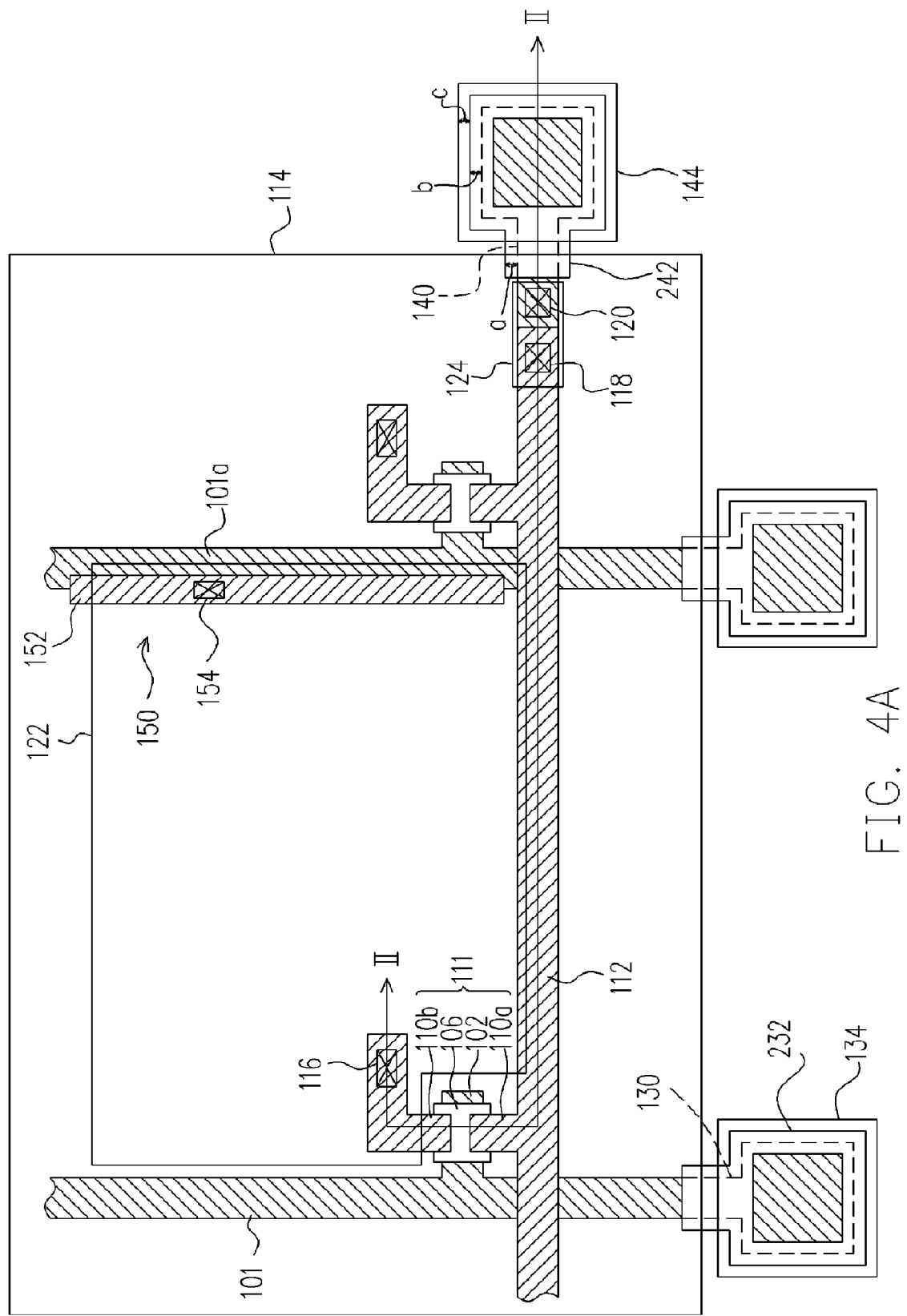
FIG. 4A is a top view illustrating a thin film transistor array according to the second embodiment of the present invention.
Figure 4B:
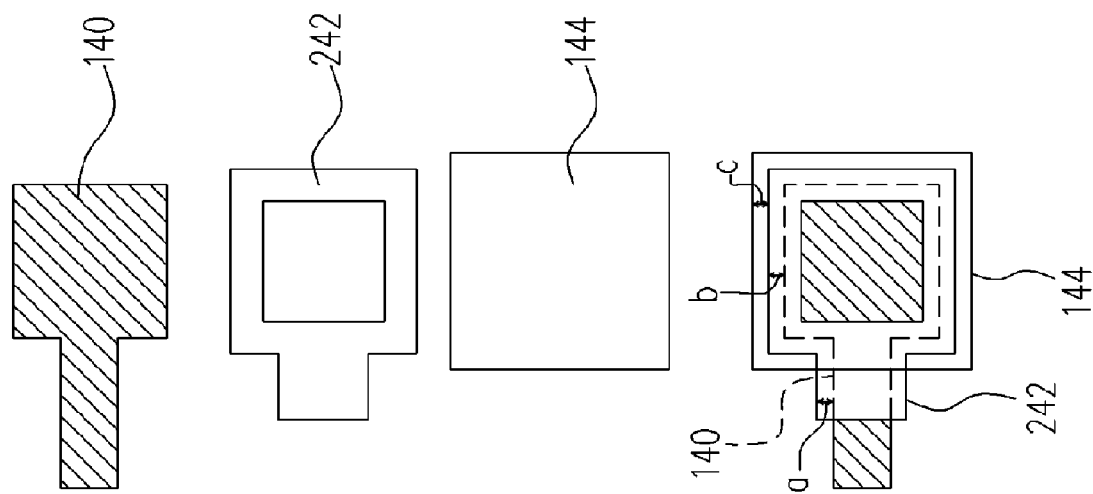
FIG. 4B is a view illustrating the bonding pad shown in FIG. 4A.

FIG. 4A is a top view illustrating a thin film transistor array according to the second embodiment of the present invention, and FIG. 4B is a perspective view illustrating the bonding pad shown in FIG. 4A. FIG. 6A to FIG. 6F are cross-sectional views illustrating the progression steps of a process of fabricating a thin film transistor array substrate corresponding to the cross-sectional views along line II–II' of FIG. 4A according to the second embodiment of the present invention. Likewise, hereinafter, a pixel structure and a portion of the bonding pad of a thin film transistor array will be described in detail referring to the above figures.

Figure 6A:
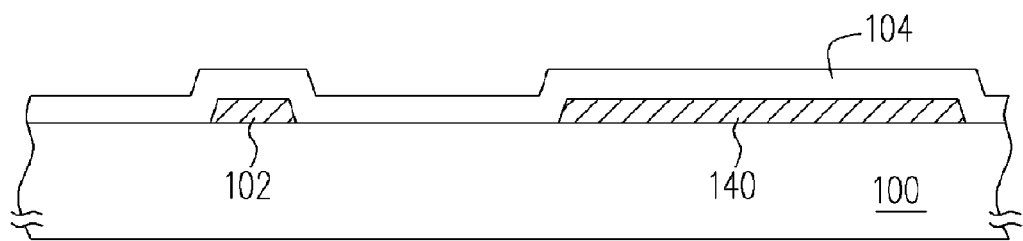
FIG. 6A to FIG. 6I are cross-sectional views illustrating the progression steps of a process of fabricating a thin film transistor array substrate corresponding to the cross-sectional views along line II–II' of FIG. 4A and FIG. 5 according to the second embodiment of the present invention.

First of all, referring to FIG. 4A and FIG. 6A, a substrate 100 is provided. A first masking process is performed to form a scan line 101 and a gate 102 over the substrate 100, wherein the gate 102 is electrically connected with the scan line 101. Next, a first bonding pad 130 and a second bonding pad 140 are simultaneously formed over two edges of the substrate 100, wherein the first bonding pad 130 is electrically connected to the scan line 101. The scan line 101, the gate 102, the first bonding pad 130 and the second bonding pad 140 are disopsed in the first metal layer.

Next, a gate dielectric layer 104 is formed over the substrate 100 to cover the scan line 101, the gate 102, the first bonding pad 130 and the second bonding pad 140.

Figure 6B:
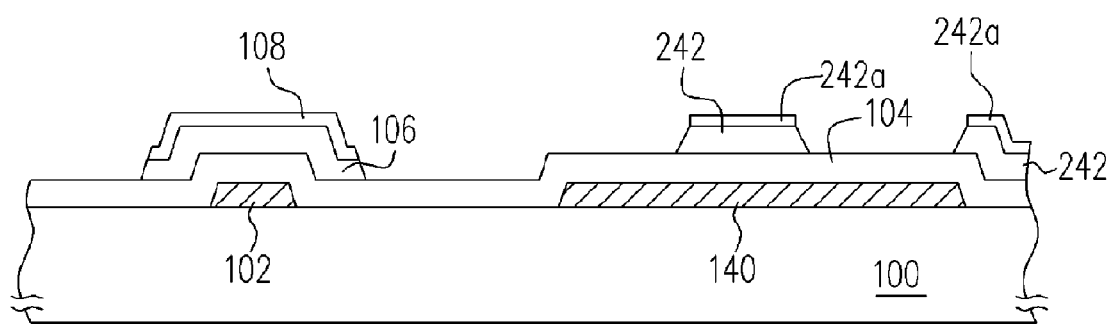

Then, referring to FIG. 4A and FIG. 6B, a second masking process is performed to form a channel layer 106 and an ohm contact layer 108 over the gate dielectric layer 104. In the meantime, a first mask layer 232 and a second mask layer 242 are formed on the gate dielectric layer 104 over the first bonding pad 130 and the second bonding pad 140. An ohm contact material layer (as numeral 242*a* shown in FIG. 6B) is formed over the first mask layer and the second mask layer 242.

The edge of the first/second bonding pad 130/140 is at least covered by the first mask layer 232 and the second mask layer 242. For example, as shown in FIG. 4B, a distance "a" and a distance "b" between the second bonding pad 140 and the second mask layer 242 is larger than or equal to 0.

Figure 6C:
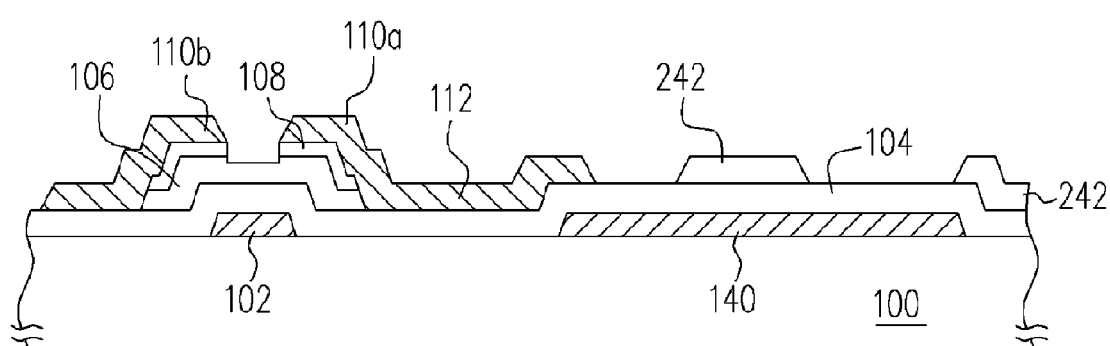

Next, referring to FIG. 4A and FIG. 6C, a third masking process is performed to form a source 110*a* and a drain 110*b* over the ohm contact layer 108, and a data line 112 connecting to the source 110*a*. A terminal of the data line 112 is extended to the second bonding pad 140. A thin film transistor 111 is constituted by the gate 102, the source 110*a*, the drain 110*b* and the channel layer 106. During the process of forming the source 110*a* the drain 110*b*, a portion of the ohm contact layer 108, or even an upper portion of the channel layer 106 will be removed. Therefore, the ohm contact material layer (as a numeral 242*a* shown in FIG. 6B) will be removed during the process of forming the first/second mask layer 242. In addition, during the step of forming the source 110*a*, the drain 110*b* and the data line 112, a conductive layer 152 is also formed on the gate dielectric layer 104 over the other scan line 101*a* adjacent to the scan line 101, which will be provided as a top electrode of a pixel storage capacitor. The source 110*a*, the drain 110*b*, the data line 112 and the conductive layer 152 are disposed in a second metal layer.

Figure 6D:
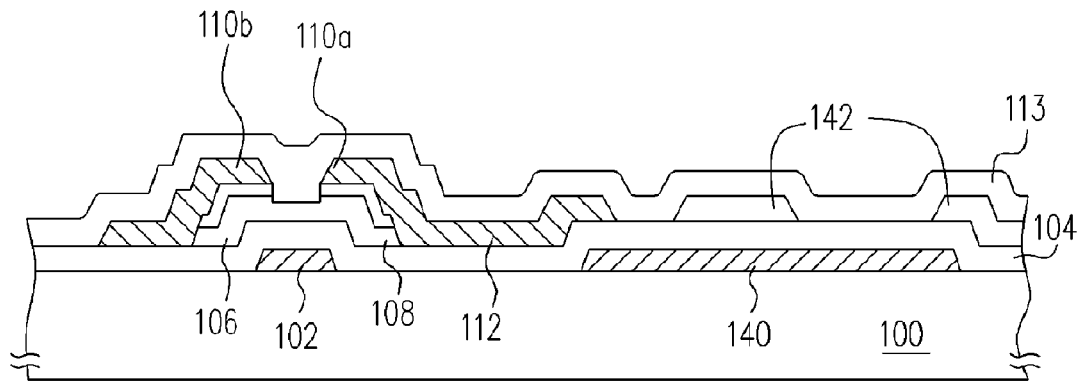

Next, referring to FIG. 6D, after the second metal layer is formed, a cover layer 113 is formed on the substrate 100 to cover the second metal layer (including the source 110*a*, the drain 110*b*, the data line 112 and the conductive layer 152).

Figure 6E:
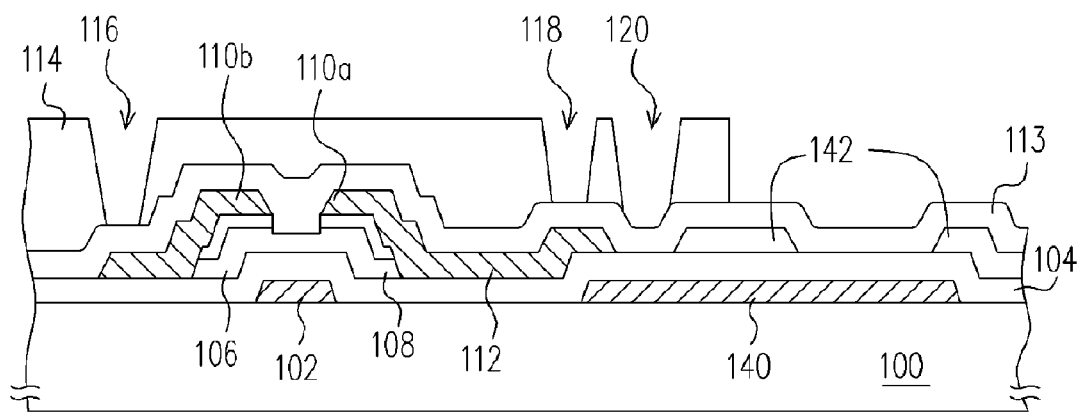
Figure 6F:
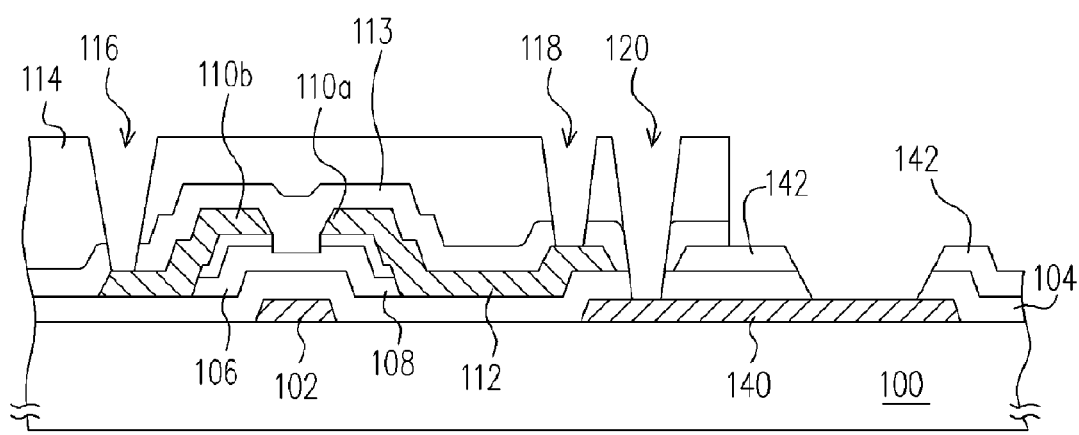

Referring to FIG. 4A and FIG. 6E, a fourth masking process is performed to form a patterned low dielectric photoresist layer 114 over the substrate 100 to cover the cover layer 113 partially covering over the two edges of the substrate 100, such that the remaining area of the cover layer 113 not covered by the low dielectric photoresist 114 over the first bonding pad 130 and the second bonding pad 140 remain exposed. The patterned low dielectric photoresist layer 114 comprises a first opening 116, a second opening 118 and a third opening 120, wherein the first opening 116 is formed over the drain 110*b*, the second opening 118 is formed over the data line 112 at the edge of the substrate 100 and the third opening 120 is formed over the second bonding pad 140.

Then, referring to FIG. 4A and FIG. 6E, an etching process is performed using the low dielectric photoresist layer 114 as a etching mask, portions of the cover layer 113 and the gate dielectric layer 104 that are not covered by the low dielectric photoresist layer 114 are removed until portions of the drain 110b, the data line 112, and the second bonding pad 140 adjacent to the data line 112 are are respectively exposed. In the above etching step, the first mask layer 232 and the second mask layer 242 over the two edges of the substrate 100 is also provided as a etching mask, thus the gate dielectric layer 104 that is not covered by the first mask layer 232 and the second mask layer 242 over the two edges of the substrate 100 is removed, and a portion of the first bonding pad 130 and a portion of second bonding pad 140 are exposed.

Figure 6G:
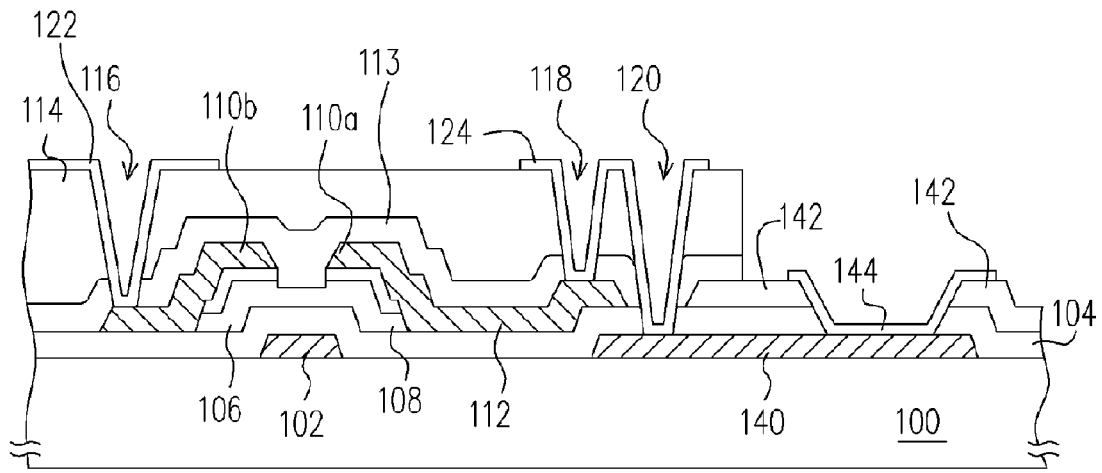

Referring FIG. 4A and FIG. 6G, a fifth masking process is performed to form a pixel electrode 122 over the low dielectric photoresist layer 114, wherein the pixel electrode 122 is electrically connected with the drain 110b via the first opening 116. During the step of forming the pixel electrode 122, an electrode material layer 124 is formed into the second opening 118 and the third opening 120, and therefore the data line 112 and second bonding pad 140 are electrically connected. The electrode material layer 134/144 respectively connects with the first bonding pad and the second bonding pad 140.

Likewise, the pixel electrode 112 formed above covers the conductive layer 152 and a portion of the scan line 101a forming a pixel storage capacitor 150.

Figure 6H:
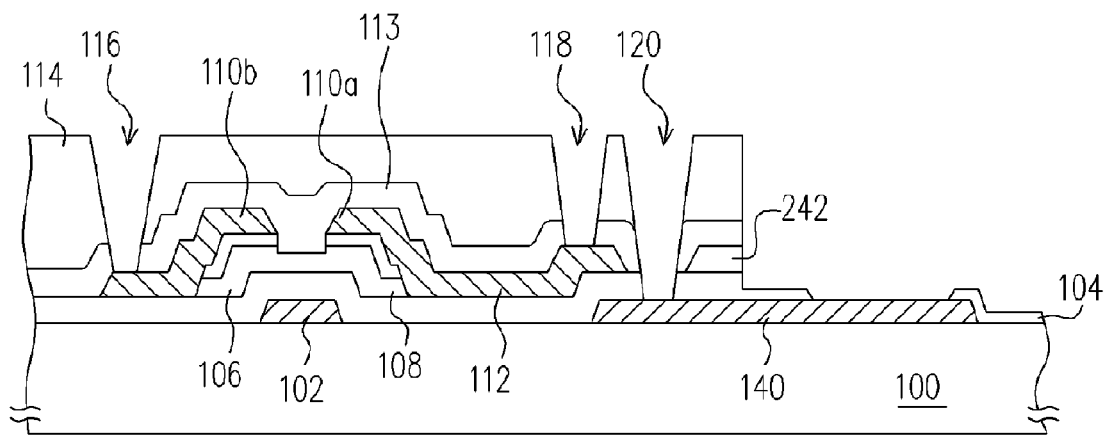
Figure 6I:
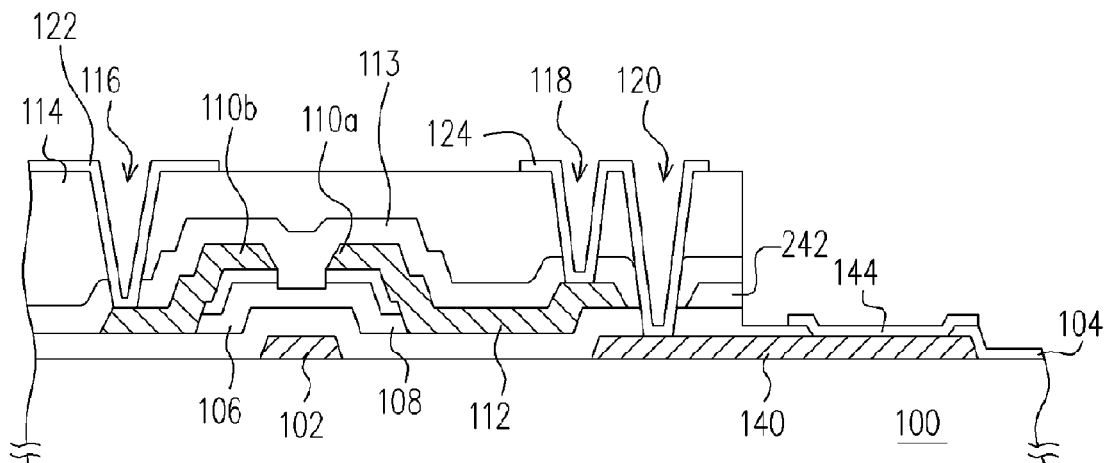

However, if the etching material used in the etching step of FIG. 6E does not have an enough etching selectivity to the amorphous silicon and the dielectric layer, the etching step may remove a portion of the first mask layer and the second mask layer 242 that is not covered by the low dielectric photoresist layer 114, or an upper portion of the gate dielectric layer 104 under the first mask layer 232 and the second mask layer 242 as shown in FIG. 6H may be removed. But, with considerable etching selectivity between the amorphous silicon and dielectric material, etching of the gate dielectric layer 104 may be effectively prevented the thickness of the gate dielectric layer 104 may be preserved. Then the fifth masking process is performed to form the pixel electrode 122 and the electrode material layers 124, 134, 144 as shown in FIG. 6I. Therefore, even though the etching stop ability of the first/second mask layer 232/242 of the amorphous silicon material layer is not as good enough as that of the metal material, but the etching selectivity of the amorphous silicon material layer inbetween the dielectric material is still sufficient to prevent the surface of the first/second bonding pad 130, 140 from getting the damage due to exposure to etchants during the etching step.

Because of the transparency of the amorphous silicon material is much larger than that of the metal material, by using the amorphous silicon material as the first/second mask layer, the first/second mask layer can be disopsed in a ring pattern (as shown in FIG. 4A) as described above. Moreover, the amorphous silicon layer can be formed covering over the two edges of the substrate that are not covered by the low dielectric photoresist layer 144, and only a portion corresponding to the first/second bonding pad 130/140 remain exposed, as shown in FIG. 5.

Figure 5:
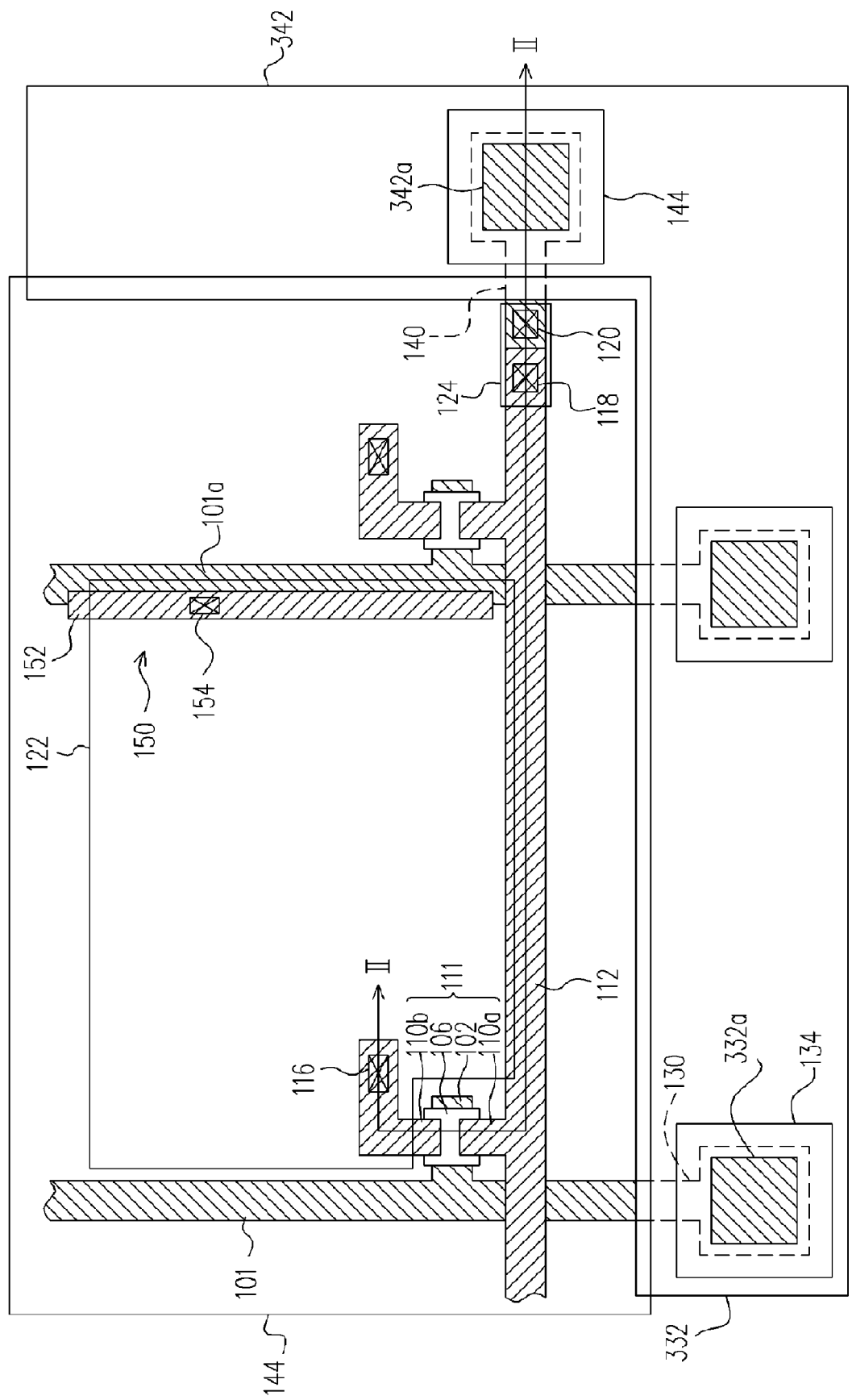
FIG. 5 is a top view illustrating another thin film transistor array according to a second embodiment of the present invention.

Referring to FIG. 5, the cross-sectional views taken along line 11-11' in FIG. 5 is shown in FIG. 6A to FIG. 6I. The process steps of fabricating thin film transistor shown in FIG. 5 is similar to FIG. 4A except that, when performing the second masking process, the design of the mask pattern used is different. That is, the second masking process of FIG. 5 further includes disposing the first/second mask layer 332/342 at the two edges of the substrate 100 except for forming the channel layer 106 and the ohm contact layer 108. The first/second mask layer 332/342 is a rectangular pattern and covers on the two edges of the substrate 100 which is not covered by the low dielectric photoresist layer 114. The opening 332a/342a is disposed in the first/second mask layer 332/342, and a first/second bonding pad 130/140 is exposed therewithin.

In other words, in the process steps of fabricating the thin film transistor shown in FIG. 5 is similar to that shown FIG. 4A except that the second masking process is different, while the other four masking processes are same.

Figure 7:
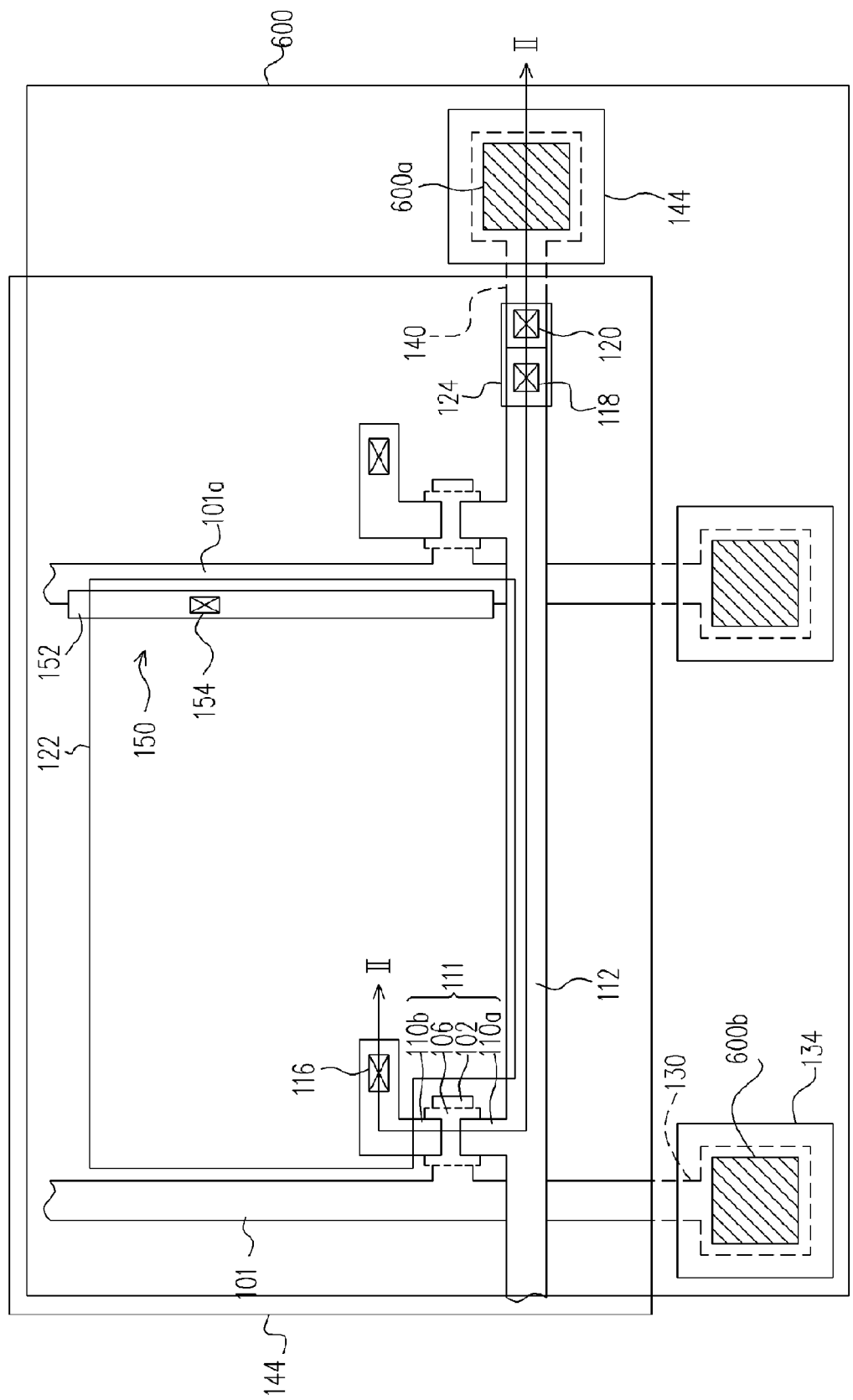
FIG. 7 is a top view illustrating another thin film transistor array according to a third embodiment of the present invention.

In the second embodiment, instead of forming the first/second mask layer as a ringed pattern (as shown in FIG. 4A), or as rectangular pattern to cover the two edges of the substrate not covered by the low dielectric photoresist layer (as shown in FIG. 5), a whole mask layer of the channel and the ohm contact material is formed. As shown FIG. 7, the bonding pad is hollowed out, and the numeral 600 represents the channel and the ohm contact material layer, and the openings 600a, 600b are formed for exposing the bonding pad 140 and 130. In the meantime, the channel 106 of the thin film transistor 111 does not have a channel pattern, instead the channel and ohm contact material layer 600 between the source 110a and the drain 110b are provided as a channel 106.

Moreover, when the whole mask layer 600 of the channel and the ohm contact material is provided as the first/second mask layer, after the etching process of the final bonding pad, the gate dielectric layer with the silicon nitride material corresponding to the opening 600a, 600b of the mask layer 600 will be totally etched, and the bonding pad 130, 140 will be exposed. Likewise, the thickness of the gate dielectric layer over the bonding pad 130, 140 that is covered by the mask layer 600 will be thinner.

Therefore, the thin film transistor (TFT) array manufactured by the method of the second embodiment has a structure that is similar to that of the first embodiment except that the first mask layer 332 and the second mask layer 342 covers the two edges of the substrate 100 that is not covered by the low dielectric photoresist layer 144. In another embodiment, except for the material of the mask layer 600 including an amorphous silicon material, the mask layer 600 covers the whole surface of the substrate 100, while only a portion corresponding to the first/second bonding pad 130/140 is exposed.

Moreover, if in the present embodiment, the first/second mask layer 232/242 (or layer 332/342, 600) is removed in the etching process, an upper portion of the gate dielectric layer 104 will also be removed, and the structure will be different from the above structure. The structure of the thin film transistor is described as follows.

The thin film transistor array is constituted by a scan line 101, a first bonding pad 130, a second bonding pad 140, a gate dielectric layer 104, a data line 112, a thin film transistor 111, a cover layer 113, a low dielectric photoresist layer 114, a pixel electrode 122 and a pixel storage capacitor 150.

The scan line 101 is disposed on the substrate 100. The first bonding pad 130 is disposed over an edge of the substrate 100, wherein the first bonding pad 130 is electrically connected with the scan line 101. The second bonding pad 140 is disposed over another edge of the substrate 100. Moreover, the gate dielectric layer 104 is disposed over the substrate 100, wherein a portion of the first bonding pad 130 and the second bonding pad 140 are exposed within a opening in the gate dielectric layer 104, and wherein the remaining portions of the first bonding pad 130 and the second bonding pad 140 remain covered by the gate dielectric layer 104. The thickness of the gate dielectric layer 104 that covers the edge of the first bonding pad 130 and the second bonding pad 140 is less than the thickness of the gate dielectric layer 104 in the pixel area. Moreover, the data line 112 is disposed over the gate dielectric layer 104, and the data line 112 extended to the edge of the substrate 100 and is electrically connected with the second bonding pad 140 via the openings 118, 120 and the electrode material layer 124 formed in the openings 118, 120.

The thin film transistor 111 is disposed over the substrate, wherein the thin film transistor 111 is constituted by a gate 102, a source 110a, a drain 101b and a channel layer 106. The gate 102 is electrically connected to the scan line 101, and the source 101a is electrically connected to the data line 112. The channel layer 106 is disposed on the gate dielectric layer 104 over the gate 102. In addition, the cover layer 113 is disposed over the substrate 100, and the low dielectric photoresist layer 114 is disposed over the cover layer 113. The two edges of the substrate 100 where the first bonding pad 130 and the second bonding pad 140 are disposed remain exposed. The pixel electrode 122 is disposed over the low dielectric photoresist layer 114 over the area corresponding to the disposed thin film transistor 111. The pixel electrode 122 is electrically connected to the drain 101b. The pixel storage capacitor 150 is disposed over the other scan line 101a adjacent to the scan line 101.

Hereinafter, a third embodiment of the present invention will be described. In the present invention, instead of using the second metal layer or the channel material layer (amorphous silicon layer) for forming the first mask layer and the second mask layer, the first/second mask layer may also be formed using a combination of the second metal layer combined and the amorphous silicon layer. In other words, when performing the second masking process and the third masking process, the pattern of the first/second mask layer is also formed simutaneously, the detailed process will be describrd as follows.

Hereinafter, FIG. 8A to FIG. 8G are cross-sectional views illustrating the progression steps of a process of fabricating a thin film transistor array substrate according to the third embodiment of the present invention.

The third embodiment is a combination of the first embodiment and the second embodiment. In other words, the first/second mask layer is a bilayer structure, in which the material of the top layer 142 is same as that of the source 1110a, the drain 1110b and the data line 112, while the material of the bottom layer 242 is same as that of the channel layer 106.

Figure 8A:
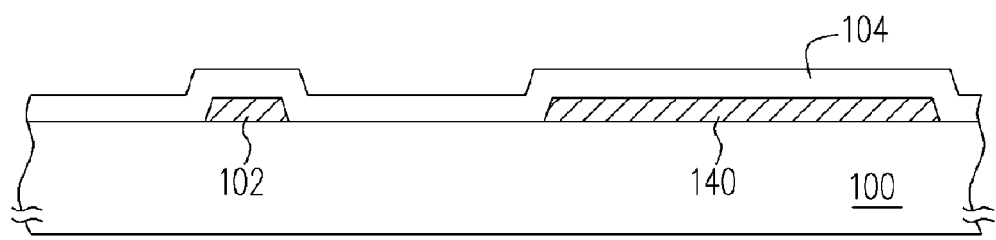
FIG. 8A to FIG. 8G are cross-sectional views illustrating the progression steps of process of fabricating a thin film transistor array substrate according to the third embodiment of the present invention.
Figure 8B:
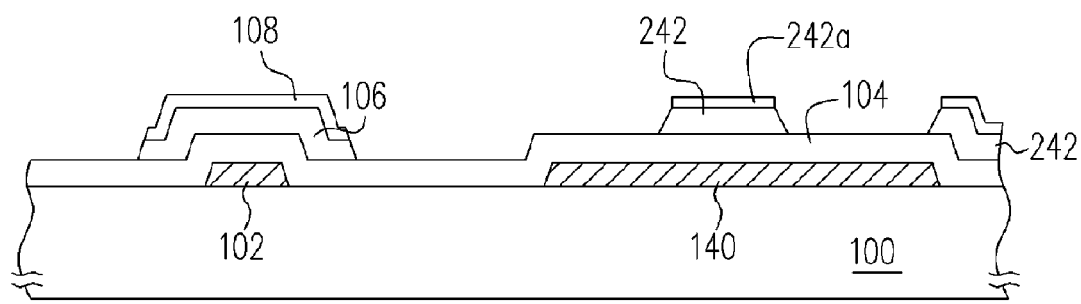
Figure 8C:
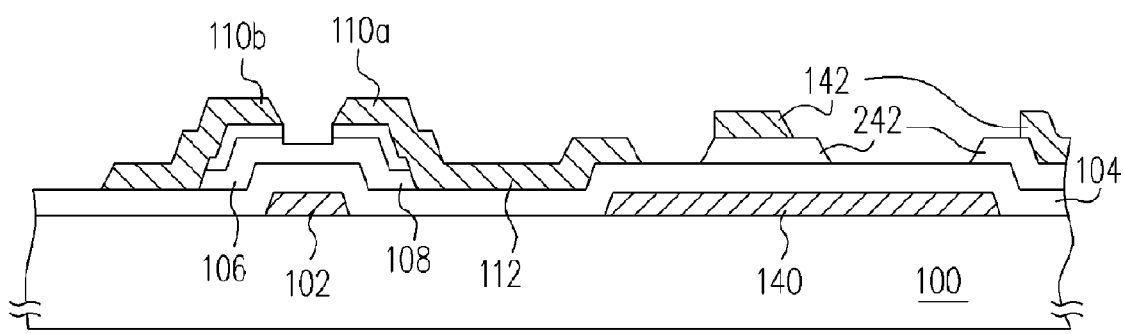
Figure 8D:
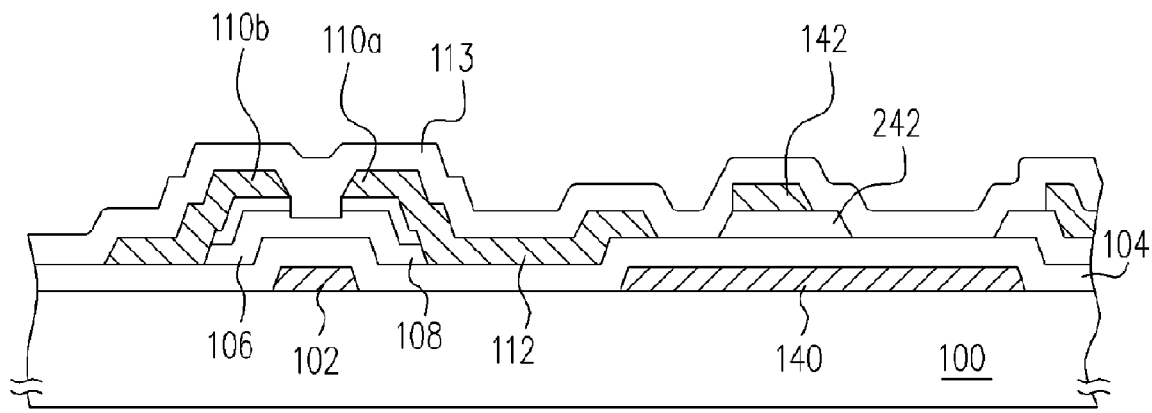
Figure 8E:
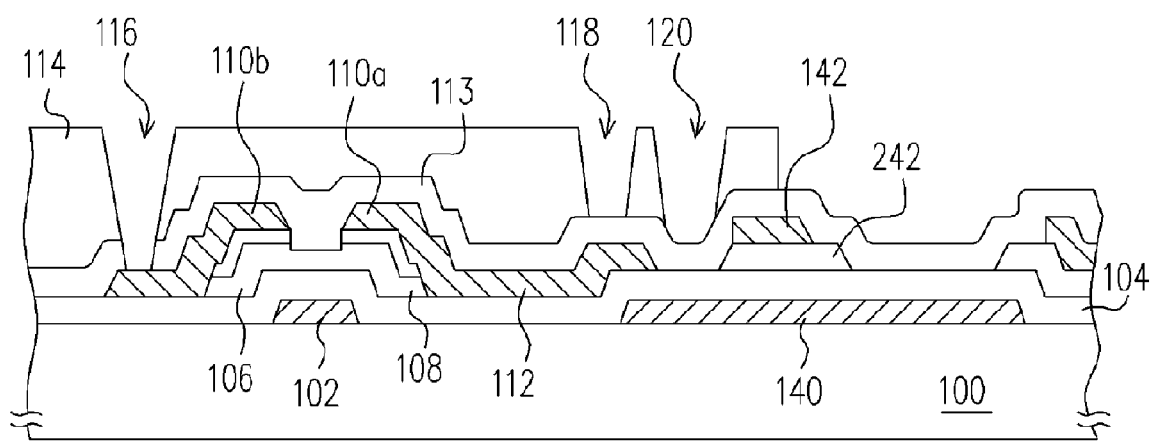
Figure 8F:
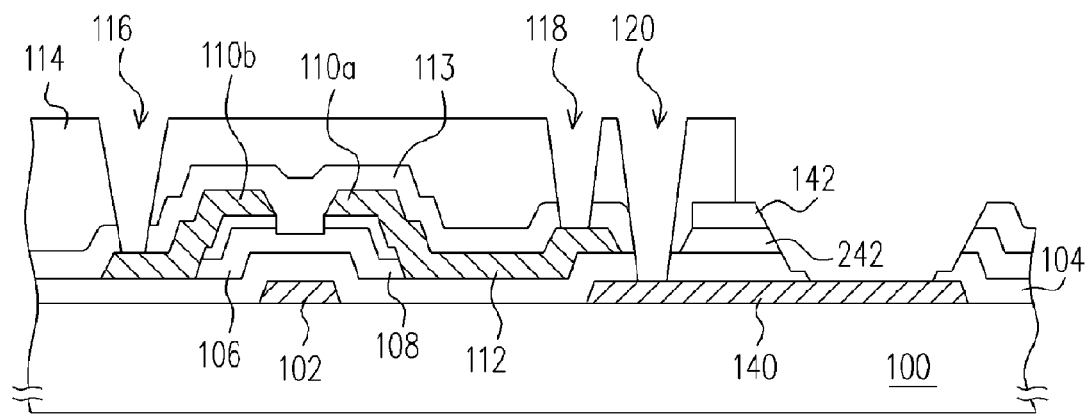
Figure 8G:
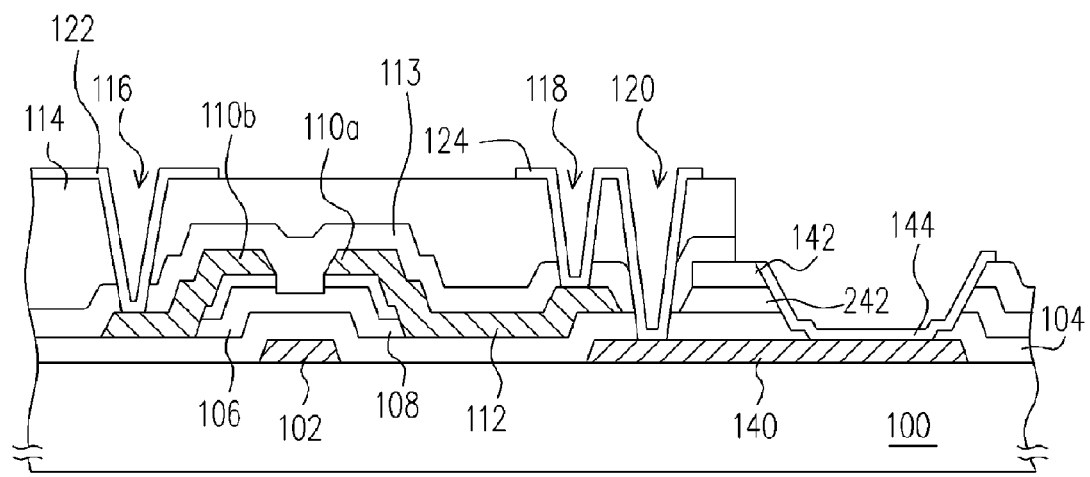

In FIG. 8A to FIG. 8G, the parts that are similar in the two (second and third) embodiments described above are represented by the same numeral, and the process steps illustrated in FIG. 8A to FIG. 8G are same for the two embodiments, except that, when the channel layer 106 is formed, the bottom layer 242 of the first/second mask layer on the gate dielectric layer 104 over the first/second bonding pad 130/140 is also formed simultaneously, as shown in FIG. 8B. And when the second metal layer (including the source 1110a, the drain 1110b, data line 112 and the conductive layer 152) are formed, the top layer structure 142 of the first/second mask layer is also formed smutaneously, as shown in FIG. 8C.

Therefore, the steps of forming the cover layer 113, the low dielectric photoresist layer 114 and the pixel electrode 112 are same for the second and the third embodiments described above.

However, it is to be noted that, in the third embodiment, the first/second mask layer is comprised of a combination of the second metal layer with the amorphous silicon layer can also include other combinations. For example, the width of the top metal layer can be less than that of the bottom amorphous silicon layer, or the width of the top metal layer can be larger than that of the bottom amorphous silicon layer. The only requirement is that the edge of the first/second bonding pad must be covered by at least one of the top metal layer or the bottom amorphous silicon layer.

Moreover, the combinations described above may also include disposing the second metal layer material over a portion of the first/second bonding pad as a mask layer, and disposing the amorphous silicon material over the other portion of the first/second bonding pad as another mask layer. Alternatively, a portion of the mask layer disposed over each one of the bonding pad is constituted by the second metal layer material, and the other portion is constituted by the amorphous silicon layer. The only requirement is that the mask layer constructed by any one or both of the second metal layer material and the amorphous silicon layer at least covers the edge of the first/second bonding pad.

The manufacturing method of the thin film transistor array substrate of the present invention is also suitable for the manufacturing a channel layer having an etching stop layer, the detailed process is described as follows.

Figure 9:
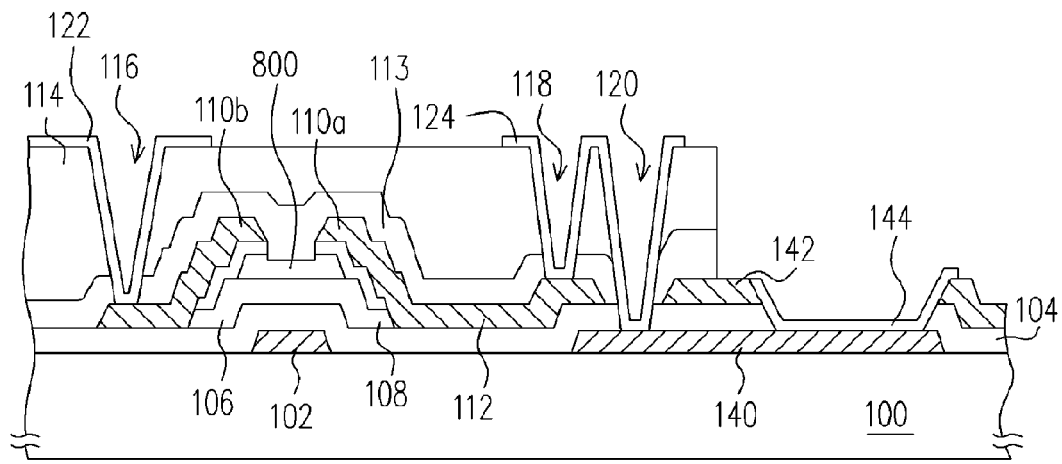
FIG. 9 is a cross-sectional view of a thin film transistor array having an etching stop layer.
Figure 10:
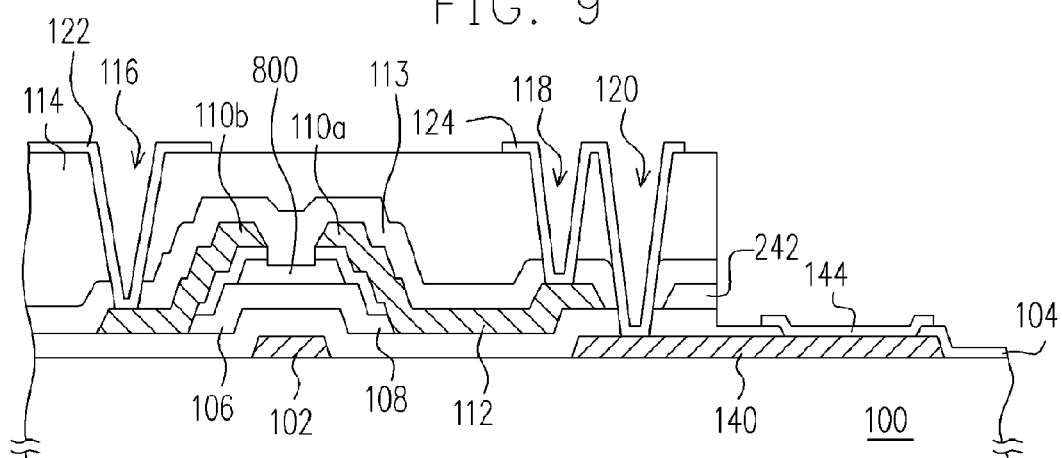
FIG. 10 is a cross-sectional view of another thin film transistor array having an etching stop layer.
Figure 11:
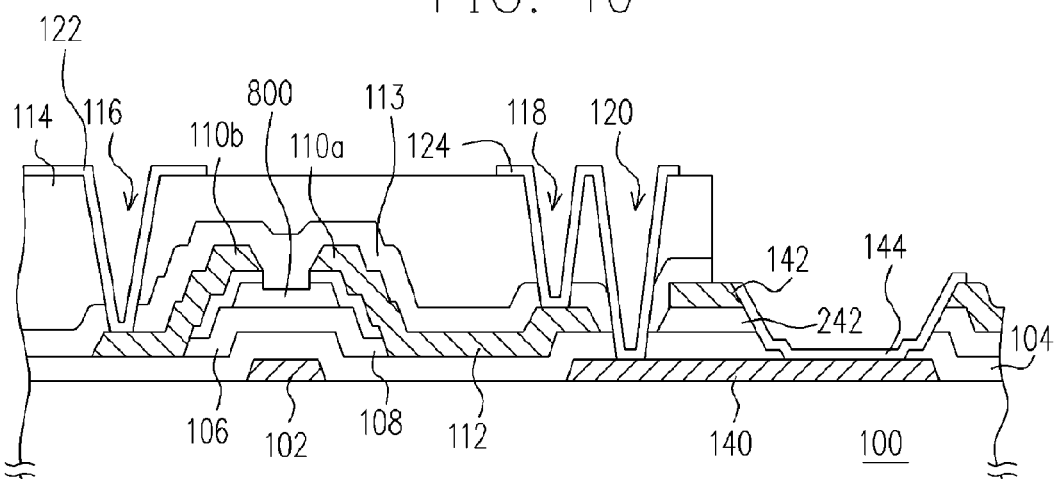
FIG. 11 is a cross-sectional view of another thin film transistor array having an etching stop layer.

Referring to FIG. 9, after forming a gate dielectric layer 104, a channel layer 106, an etching stop layer 800 and an ohm contact layer 108 are formed on the gate dielectric layer 104. Then, a second metal layer is formed over the substrate and patterned until the etching stop layer 800 is exposed to form a source 1110a, a drain 1110b and a data line 112. While the other process steps are similar to the process steps described above. For example, in FIG. 9, the method of using a second metal layer as a first/second mask layer is similar to the method described in the first embodiment. And in FIG. 10, the method of using an amorphous silicon material as a first/second mask layer is similar to the method described in the second embodiment. And in FIG. 11, the method of using a second metal layer combined with an amorphous silicon material as a first/second mask layer is similar to the method described in the second embodiment. In other words, in a manufacturing process of a thin film transistor having etching stop layer of the present invention, the steps of forming the first/second mask layer can be provided by any one of the three embodiments described above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a thin film transistor (TFT) array substrate, comprising:

providing a substrate;

forming a plurality of scan lines and a plurality of gates electrically connected to said scan lines on the substrate;

simultaneously forming a plurality of first bonding pads and a plurality of second bonding pads over two edges of the substrate, wherein said first bonding pads are electrically connected with said scan lines;

forming a gate dielectric layer over the substrate, for covering said scan lines, said gates, said first bonding pads and said second bonding pads;

forming a plurality of channel layers over said gate dielectric layers of each of said gates;

forming an ohm contact layers on each of said channel layers;

forming a source and a drain on each of the said contact layers;

forming a data line electrically connecting to each of said sources on the gate dielectric layers, wherein a terminal of each of said data lines is extended to each of the second bonding pads, and wherein said gates, each of said channel layers and each of said sources and each of said drain constitute a of thin film transistor;

forming a mask layer over said gate dielectric layers, wherein said mask layer is disposed over areas corresponding to said first bonding pads and said second bonding pads;

forming a cover layer over said substrate;

forming a patterned photoresist layer over said cover layer, wherein said photoresist layer partially covering over said two edges of the substrate, wherein said photoresist layer comprises a plurality of first openings, a plurality of second openings and a plurality of third openings, wherein said drains are exposed within said first openings, said data lines are exposed within said second openings, and said second bonding pads are exposed within said third openings;

performing an etching process by using the photoresist layer as an etching mask for removing portions of said cover layer and portions of said gate dielectric layers that are not covered by the photoresist layer and exposing a portion of said second bonding pads that are not covered by said photoresist layer; and forming an electrode material layer over said photoresist layer to form a plurality of pixel electrodes over said photoresist layer, wherein said electrode material layer fills in each of said first openings, said second openings and said third openings, and wherein said drains are electrically connected with said pixel electrodes via the first openings, said data lines are electrically connected with said second bonding pads via said second openings, said third openings and said electrode material layer.

2. The method of claim 1, wherein siad mask layer is formed during the step of forming said source, said drain and said data lines, or during the step of forming said channel layers and said ohm contact layers, or by a combination of said steps thereof.

3. The method of claim 2, wherein said mask layer comprises a ring pattern, and covers a pherpheral area over said first bonding pads and said second bonding pads.

4. The method of claim 2, wherein said mask layer layer is formed during the step of forming said channel layers and said ohm contact layers, and wherein said mask layer comprises a plurality of openings having rectangular block patterns covering over said two edges of the substrate.

5. The method of claim 2, wherein said mask layer is formed during the step of forming said channel layers and said ohm contact layers, wherein said mask layer comprises a plurality of openings covering the whole substrate, and wherein a portion of said gate dielectric layer covering said first bonding pads and said second bonding pads is exposed within said openings.

6. The method of claim 2, wherein said mask layer is formed during the step of forming said channel layers and said ohm contact layers, and in the step of removing said cover layer and said gate dielectric layer that are not covered by the photoresist layer by using the photoresist layer as an etching mask, and removing an upper portion of of said mask layer.

7. The method of claim 1, wherein said mask layer comprises a bilayer structure having a top layer and a bottom layer, wherein said top layer is formed during the step of forming said source, said drain and said data lines, and said bottom layer is formed during the step of forming said channel layers and said ohm contact layers.

8. The method of claim 1, wherein before the step of forming said ohm contact layers, further comprises a step of forming an etching stop layer over each of said channel layers over each of said gates.

* * * * *